(12) United States Patent
Aoike et al.

(10) Patent No.: US 8,299,499 B2
(45) Date of Patent: Oct. 30, 2012

(54) FIELD EFFECT TRANSISTOR

(75) Inventors: Masayuki Aoike, Kanagawa (JP);
Yasunori Bito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 296 days.

(21) Appl. No.: 12/632,364

(22) Filed: Dec. 7, 2009

(65) Prior Publication Data

US 2010/0140672 A1  Jun. 10, 2010

(30) Foreign Application Priority Data

Dec. 5, 2008  (JP) .................................. 2008-310718

(51) Int. Cl.
*H01L 29/66* (2006.01)
(52) U.S. Cl. ........ 257/194; 257/192; 257/284; 257/615; 257/754; 257/622; 257/655
(58) Field of Classification Search .................. 257/192, 257/194, 284, 615, 754, 622, 655
See application file for complete search history.

(56) References Cited

U.S. PATENT DOCUMENTS

| | | | |
|---|---|---|---|
| 5,504,353 A | | 4/1996 | Kuzuhara |
| 5,952,672 A | * | 9/1999 | Kikkawa ........................ 257/15 |
| 6,087,207 A | | 7/2000 | Tong |
| 6,936,870 B2 | * | 8/2005 | Nishihori et al. ............. 257/194 |
| 2002/0171076 A1 | * | 11/2002 | Danzilio ........................ 257/12 |
| 2004/0164317 A1 | | 8/2004 | Nishihori et al. |

FOREIGN PATENT DOCUMENTS

| | | |
|---|---|---|
| JP | 7-335867 | 12/1995 |
| JP | 2002-526922 | 8/2002 |
| JP | 2004-193273 | 7/2004 |

OTHER PUBLICATIONS

Tanaka et al., "Ordering-induced electron accumulation at GaInP/GaAs hetero-interfaces", Journal of Crystal Growth 221 (2000) 515-519.

\* cited by examiner

*Primary Examiner* — Steven Loke
*Assistant Examiner* — Cuong Nguyen
(74) *Attorney, Agent, or Firm* — Young & Thompson

(57) ABSTRACT

A field effect transistor includes a Schottky layer; a stopper layer formed of InGaP and provided in a recess region on the Schottky layer; a cap layer provided on the stopper layer and formed of GaAs; and a barrier rising suppression region configured to suppress rising of a potential barrier due to interface charge between the stopper layer and the cap layer. The cap layer includes a high concentration cap layer; and a low concentration cap layer provided directly or indirectly under the high concentration cap layer and having an impurity concentration lower than the high concentration cap layer.

12 Claims, 24 Drawing Sheets

FIELD EFFECT TRANSISTOR

INCORPORATION BY REFERENCE

This patent application claims a priority on convention based on Japanese Patent Application No. 2008-310718. The disclosure thereof is incorporated herein by reference.

BACKGROUND OF THE INVENTION

1. Field of the Invention

The present invention relates to a field-effect transistor, and especially relates to a field-effect transistor using gallium arsenide as material.

2. Description of Related Art

As a microfabrication technique advances, a semiconductor device that includes a field-effect transistor using gallium arsenide as, material (hereinafter, to be sometimes referred to as a GaAs device) is supplied in a low price. The GaAs device is widely used as a Switch IC (SWIC) for small-sized, high-frequency operated electronics, such as a mobile phone and a PDA.

For the mobile handset, a SWIC with low harmonic distortion characteristics is in great demand. A general SWIC includes a DC-DC boost converter fabricated by Si CMOS process and a GaAs FET package. Biased at a high control voltage boosted by the DC-DC converter, the device exhibits high isolation characteristics and low harmonic distortion characteristics. A technique related to the GaAs device having such configuration is known in the following conventional examples 1 to 3.

The conventional example 1 (Japanese Patent Application Publication (JP 2004-193273A)) discloses a heterojunction type compound semiconductor field-effect transistor having a gate electrode in a recess portion formed by a selective etching utilizing an undoped InGaP stopper layer. FIG. 1 is a cross-sectional view showing a structure of the heterojunction type compound semiconductor field-effect transistor described in the conventional example 1. As shown in FIG. 1, in the conventional heterojunction type compound semiconductor field-effect transistor, a semi-insulating GaAs substrate 111, a buffer layer 112, an n-AlGaAs electron supply lower layer 113, an i-InGaAs channel layer 114, an n-AlGaAs electron supply layer 115, an i-InGaP electric field moderating layer 116, an n-GaAs contact lower layer 117, a recess stopper layer 150, and an n$^+$-GaAs contact upper layer 118 are laminated in order.

An undoped GaAs layer formed as the buffer layer 112 on the semi-insulating GaAs substrate 111. An n-Al$_{0.2}$Ga$_{0.8}$As layer is laminated as the n-AlGaAs electron supply lower layer 113 on the buffer layer 112. An i-Al$_{0.2}$Ga$_{0.8}$As layer is formed as a lower-side spacer layer (not shown) on the n-AlGaAs electron supply lower layer 113. An i-In$_{0.15}$Ga$_{0.85}$As layer is formed as the i-InGaAs channel layer 114 on the lower-side spacer layer. An i-Al$_{0.2}$Ga$_{0.8}$As layer is laminated as an upper-side spacer layer (not shown) on the i-InGaAs channel layer 114, and an n-Al$_{0.2}$Ga$_{0.8}$As layer is laminated as the upper-side n-AlGaAs electron supply layer 115 on the i-InGaAs channel layer 114. An i-In$_{0.48}$Ga$_{0.52}$P layer is formed as the i-InGaP electric field moderating layer 116 on the n-AlGaAs electron supply layer 115. In addition, an n-GaAs layer is formed as the n-GaAs contact lower layer 117 (a first contact layer). Moreover, a low-resistance n$^+$-GaAs layer is formed as the n$^+$-GaAs contact upper layer 118 (a second contact layer). The respective layers are laminated in order. An i-In$_{0.49}$Ga$_{0.51}$P layer is laminated as the recess stopper layer 150 on the n-GaAs contact lower layer 117. A low-resistance n$^+$-GaAs layer is laminated as the n$^+$-GaAs contact upper layer 118 on the recess stopper layer 150. A source electrode 120 and a drain electrode 121, each of which includes Ni—AuGe—Au alloy layer, are formed on a surface of the n$^+$-GaAs contact upper layer 118, so that a wide recess opening 105 can be put between the electrodes. In the n$^+$-GaAs contact upper layer 118, the wide recess opening 105 is formed by an etching of the n$^+$-GaAs contact upper layer 118. Inside the wide recess opening 105, a narrow recess opening 110 having a narrower width than an opening width of the wide recess opening 105 is formed by an etching of the recess stopper layer 150, the n-GaAs contact lower layer 117, and the i-InGaP electric field moderating layer 116. A gate electrode 122 including Al is formed on a surface of the n-AlGaAs electron supply layer 115 exposed to a bottom portion of the narrow recess opening 110.

FIG. 2 is a cross-sectional view showing another structure of the heterojunction type compound semiconductor field-effect transistor described in conventional example 1. As shown in FIG. 2, the recess stopper 150 is not provided in the heterojunction type compound semiconductor field-effect transistor. The wide recess opening 105 is formed by an etching of the n$^+$-GaAs contact upper layer 118. The narrow recess opening 110 is formed inside the wide recess opening 105 by an etching of the n-GaAs contact lower layer 117 and the i-InGaP electric field moderating layer 116 and to have a narrower width than the opening width of the wide recess opening 105. The heterojunction type compound semiconductor field-effect transistor has a double-recess structure of the wide recess opening 105 and the narrow recess opening 110.

A gate electrode 122 including, for example, Al is formed on a surface of the n-AlGaAs electron supply layer 115 exposed to a bottom portion of the narrow recess opening 110. The source electrode 120 and the drain electrode 121, each of which includes, for example, a Ni—AuGe—Au alloy layer, are formed on the above-described n$^+$-GaAs contact upper layer 118, so that the above-mentioned wide recess opening 105 can be put between the electrodes. The n-GaAs contact lower layer 117 defining the narrow recess opening 110 contains GaAs to which an n-type impurity is added, and the n$^+$-GaAs contact upper layer 118 defining the wide recess opening 105 is also formed by containing GaAs to which the n-type impurity is added in higher concentration. Furthermore, the i-InGaP electric field moderating layer 116 is formed of intrinsic-type InGaP.

In addition, the conventional example 2 (Japanese Patent Application Publication (JP-A-Heisei 7-335867A)) discloses a technique related to a heterojunction type compound semiconductor field-effect transistor of a double-recess structure to which a selective etching technique can be applied, and which has a high performance, and has good uniformity and good reproductivity. Moreover, the conventional example 3 (Japanese Patent Application Publication (JP 2002-526922A)) discloses a technique related to a pseudomorphic high electron mobility transistor.

Since a potential barrier to electrons from an ohmic electrode to a channel layer is formed in the double-recess structure in which the InGaP layer and the AlGaAs layer are inserted into a GaAs cap layer, a contact resistance will become high. In addition, since a layer having low impurity concentration is employed as an electric field moderating layer in the GaAs cap layer, a potential barrier of the InGaP layer rises. Therefore, the contact resistance will become high. Thus, in a conventional FET structure that a gate electrode is arranged in a gate recess section formed with an InGaP stopper layer, it was difficult to realize a low gate leakage current and a low on-resistance at a same time.

In addition, when the cap layer consists of only a highly Si impurity doped semiconductor layer, the device will exhibit a low drain breakdown voltage.

SUMMARY OF THE INVENTION

In an aspect of the present invention, a field effect transistor includes a Schottky layer; a stopper layer formed of InGaP and provided in a recess region on the Schottky layer; a cap layer provided on the stopper layer and formed of GaAs; and a barrier rising suppression region configured to suppress rising of a potential barrier due to interface charge between the stopper layer and the cap layer. The cap layer includes a high concentration cap layer; and a low concentration cap layer provided directly or indirectly under the high concentration cap layer and having an impurity concentration lower than the high concentration cap layer.

In the present invention, a boosted control voltage can be efficiently sent to the GaAs FET by reducing a gate leakage current, and an off-state can be maintained to a large signal inputted from a power amplifier by realizing a high breakdown voltage. Accordingly, low loss of an input signal can be realized by reducing an on-resistance.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF PREFERRED EMBODIMENTS

Figure 1:
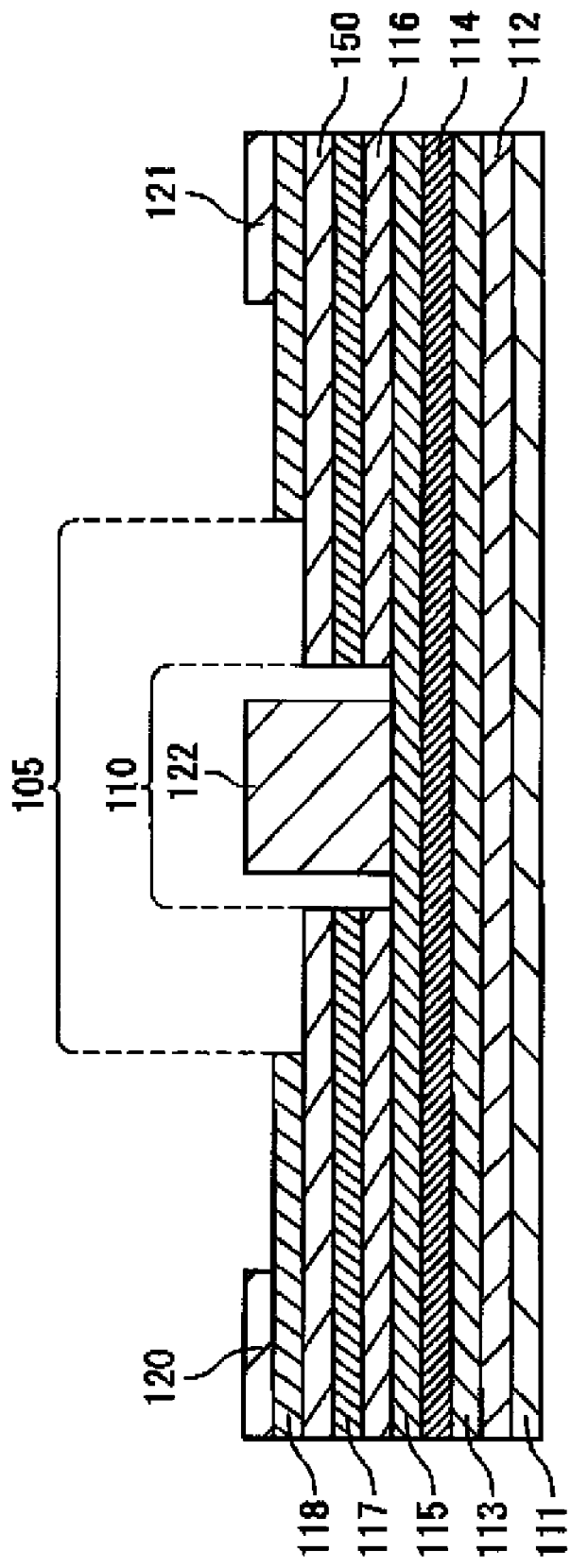
FIG. 1 is a cross-sectional view of a conventional field-effect transistor.
Figure 2:
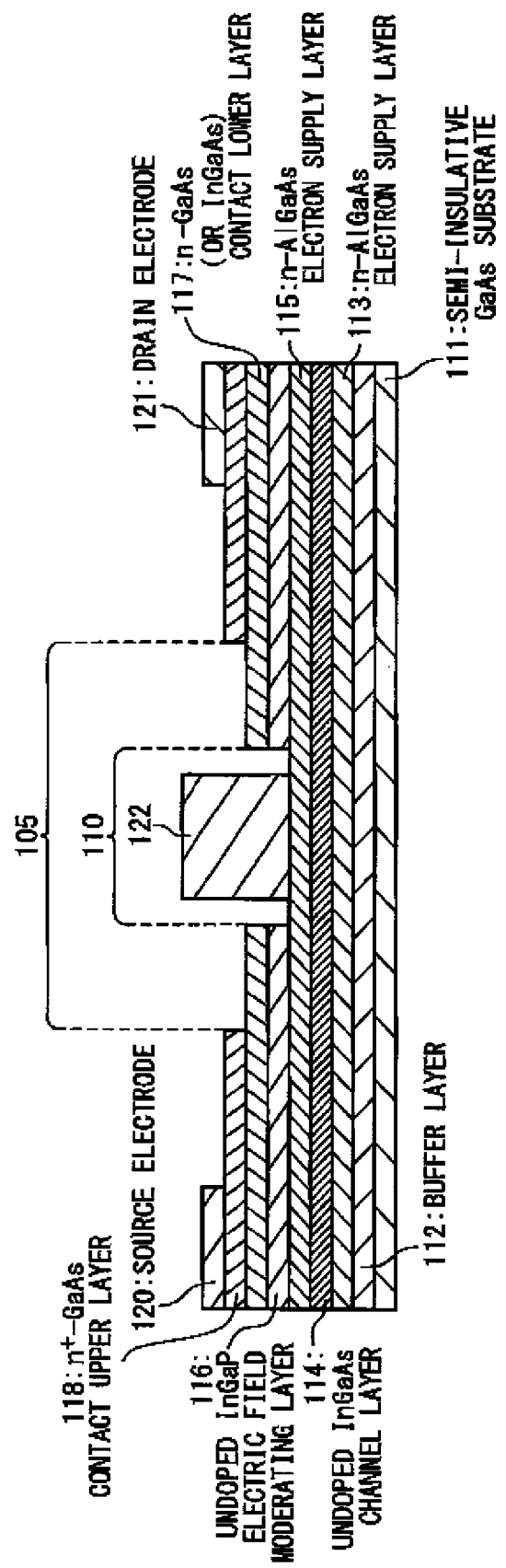
FIG. 2 is a cross-sectional view of another conventional field-effect transistor.

Hereinafter, a field-effect transistor of the present invention will be described in detail with reference to the attached drawings. In the drawings, the same, reference numerals are assigned to the same components and the repetitive description thereof is omitted.

[First Embodiment]

Figure 3:
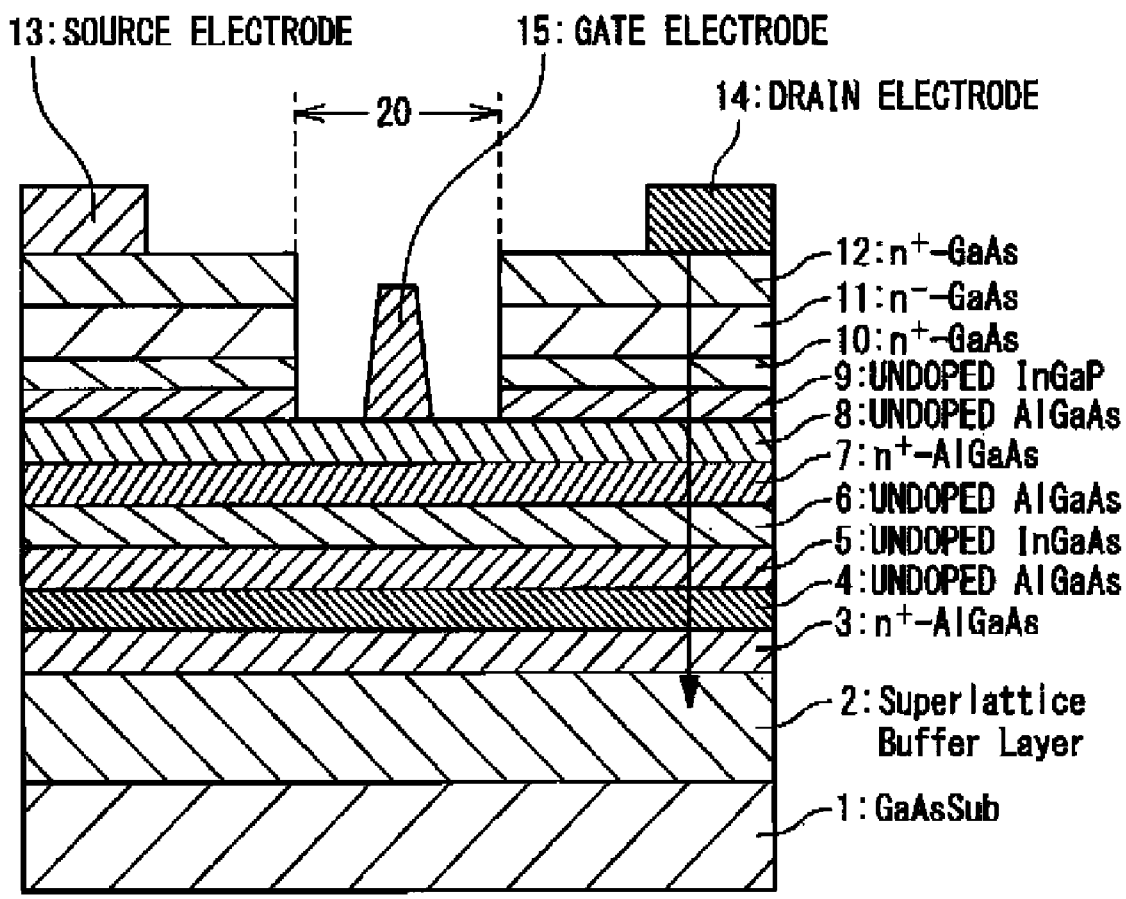
FIG. 3 is a cross-sectional view of a field-effect transistor according to a first embodiment of the present invention.

FIG. 3 is a cross-sectional view showing the structure of the field-effect transistor according to a first embodiment of the present invention. An epitaxial wafer of the field-effect transistor according to the present embodiment includes a semi-insulating GaAs substrate 1 (a compound semiconductor substrate), a buffer layer 2, an Si-doped AlGaAs electron supply layer 3, an undoped AlGaAs layer 4, an undoped InGaAs channel layer 5, an undoped AlGaAs layer 6, an Si-doped AlGaAs electron supply layer 7, an undoped AlGaAs layer 8, an undoped InGaP (hereinafter, to be referred to as order-InGaP) stopper layer 9 in which a spontaneous superlattice is formed, an Si-doped GaAs carrier compensation layer (high concentration) 10, an Si-doped GaAs cap layer (low concentration) 11, and an Si-doped GaAs cap layer (high concentration) 12. It should be noted that in the following embodiments, a region defined as an undoped region means a region where an impurity is not intentionally added. In addition, an undoped layer includes a layer which functions in a same manner as an undoped layer, for example, a layer containing the impurity of $1.0 \times 10^{16}$ cm$^{-3}$ or less.

The buffer layer 2 is formed on the semi-insulating GaAs substrate 1 to have the film thickness of approximately 800 nm. The Si-doped AlGaAs electron supply layer 3 contains Si-impurity of approximately $2.3 \times 10^{18}$ cm$^{-3}$. In addition, the Si-doped AlGaAs electron supply layer 3 is formed to have the film thickness of approximately 5 nm. The undoped AlGaAs layer 4 is formed to have the film thickness of approximately 2 nm. Additionally, the undoped AlGaAs layer 4 is formed without being intentionally added with any impurity. The undoped InGaAs channel layer 5 is formed to have the film thickness of approximately 15 nm. In addition, the undoped InGaAs channel layer 5 is formed without being intentionally added with any impurity. The undoped AlGaAs layer 6 is formed to have the film thickness of approximately 2 nm. In addition, the undoped AlGaAs layer 6 is formed without being intentionally added with any impurity. The Si-doped AlGaAs electron supply layer 7 is formed so as to contain Si impurity of approximately $2.3 \times 10^{18}$ cm$^{-3}$. In addition, the Si-doped AlGaAs electron supply layer 7 is formed to have the film thickness of approximately 13 nm. The undoped AlGaAs layer 8 is formed to have the film thickness of approximately 29 nm. In addition, the undoped AlGaAs layer 8 is formed without being intentionally added with any impurity.

The undoped InGaP stopper layer 9 is formed to have the film thickness of approximately 10 nm. In addition, the undoped InGaP stopper layer 9 is formed without being intentionally added with any impurity. The Si-doped GaAs carrier compensation layer (high concentration) 10 is formed so as to contain Si impurity of approximately $3.0 \times 10^{18}$ cm$^{-3}$. The Si-doped GaAs carrier compensation layer (high concentration) 10 is formed to have the film thickness of approximately 5 nm. The Si-doped GaAs cap layer (low concentration) 11 is formed so as to contain Si impurity of approximately $4.0 \times 10^{17}$ cm$^{-3}$. The Si-doped GaAs cap layer (low concentration) 11 is formed to have the film thickness of approximately 100 nm. The Si-doped GaAs cap layer (high concentration) 12 is formed so as to contain Si impurity of approximately $4.0 \times 10^{18}$ cm$^{-3}$. The Si-doped GaAs cap layer (high concentration) 12 is formed to have the film thickness of approximately 50 nm.

As shown in FIG. 3, the field-effect transistor according to the present embodiment includes a source electrode 13, a drain electrode 14, and a Ti—Al gate electrode 15. The source electrode 13 includes a Ni—AuGe—Au alloy layer. The drain electrode 14 also includes a Ni—AuGe—Au alloy layer. In addition, the Ti—Al gate electrode 15 is arranged at a gate opening 20.

Referring to FIG. 3, the Si-doped GaAs carrier compensation layer (high concentration) 10, the Si-doped GaAs cap layer (low concentration) 11, and the Si-doped GaAs cap layer (high concentration) 12 constitute a GaAs cap layer. A recess portion corresponding to the gate opening 20 is formed by sequentially etching the Si-doped GaAs cap layer (high concentration) 12, the Si-doped GaAs cap layer (low concentration) 11, and the Si-doped GaAs carrier compensation layer (high concentration) 10 that are laminated, and by further etching the undoped InGaP stopper layer 9. The Ti—Al gate electrode 15 contacts a bottom surface of the recess portion to form the field-effect transistor.

The field-effect transistor according to the present embodiment forms a high concentration region, a low concentration region, and a carrier compensation layer region by changing the concentration of Si impurity in the GaAs cap layer, and has a single recess structure having an InGaP stopper layer.

Here, it is preferable that the film thickness of the Si-doped GaAs cap layer (high concentration) 12 is thicker than 40 nm. When the film thickness of the Si-doped GaAs cap layer (high concentration) 12 is 40 nm or less, there is a possibility that the source electrode 13 and the drain electrode 14 each including the Ni—AuGe—Au alloy layers penetrate the high concentration layer because of a high-temperature process. When the source electrode 13 and the drain electrode 14 have penetrated the high concentration layer, an on-resistance will becomes high.

In addition, it is preferable that the film thickness of the Si-doped GaAs cap layer (low concentration) 11 is thicker than 50 nm. When the film thickness of the Si-doped GaAs cap layer (low concentration) 11 is 50 nm or less, an electric field moderating effect in the low concentration layer will be reduced. Accordingly, reduction of the gate leakage current may be insufficient.

In addition, it is preferable that an impurity concentration of the Si-doped GaAs carrier compensation layer (high concentration) 10 is higher than $1 \times 10^{18}$ cm$^{-3}$. The order-InGaP with a spontaneous superlattice structure has a strong spontaneous polarization generating an interface charge. When the Si impurity concentration of the carrier compensation layer is low, a potential barrier formed by the interface charge of the order-InGaP stopper layer rises, resulting in increase of the on-resistance.

Moreover, it is preferable that the InGaP stopper layer of the field-effect transistor according to the present embodiment is 3 nm or more. If the layer is thinner than this value, the InGaP stopper layer will be penetrated in the etching of the Si-doped GaAs cap layer (high concentration) 12, the Si-doped GaAs cap layer (low concentration) 11, and the Si-doped GaAs carrier compensation layer (high concentration) 10, and a gate forward turn-on voltage will be degraded. Additionally, in consideration of the lattice matching with the GaAs substrate, it is desirable that a composition of In in $In_xGa_{1-x}P$ satisfies $0.4 \leq x \leq 0.6$. It should be noted that a technique related to the order-InGaP is described in the reference by "Takeshi Tanaka, Kazuto Takeno, Tadayoshi Tsuchiya, and Harunori Sakaguchi (J. Crystal Growth 221 (2000), pp. 515-519).

Figure 4:
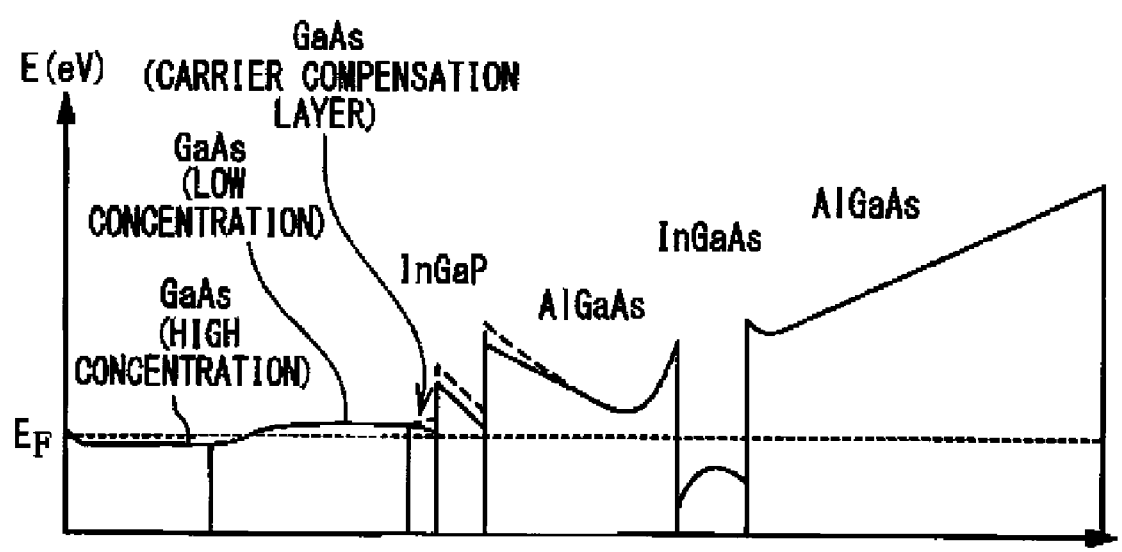
FIG. 4 is a diagram of a potential band from a cap layer to a channel layer in the field-effect transistor according to the first embodiment.

FIG. 4 is a potential band diagram from the cap layer to the channel layer in the above-described field-effect transistor. The field-effect transistor according to the present embodiment includes the high concentration region and the low concentration region each formed by changing the Si impurity concentration in the GaAs cap layer. In addition, the field-effect transistor has a single recess structure having the carrier compensation layer region and the InGaP stopper layer.

Figure 5:
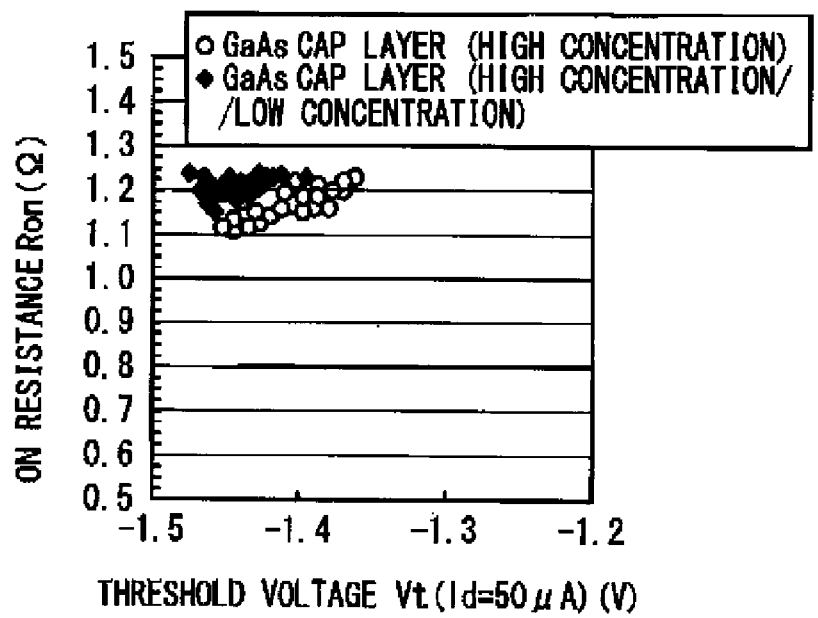
FIG. 5 is a diagram showing an on-resistance characteristic in the field-effect transistor according to the first embodiment.
Figure 6:
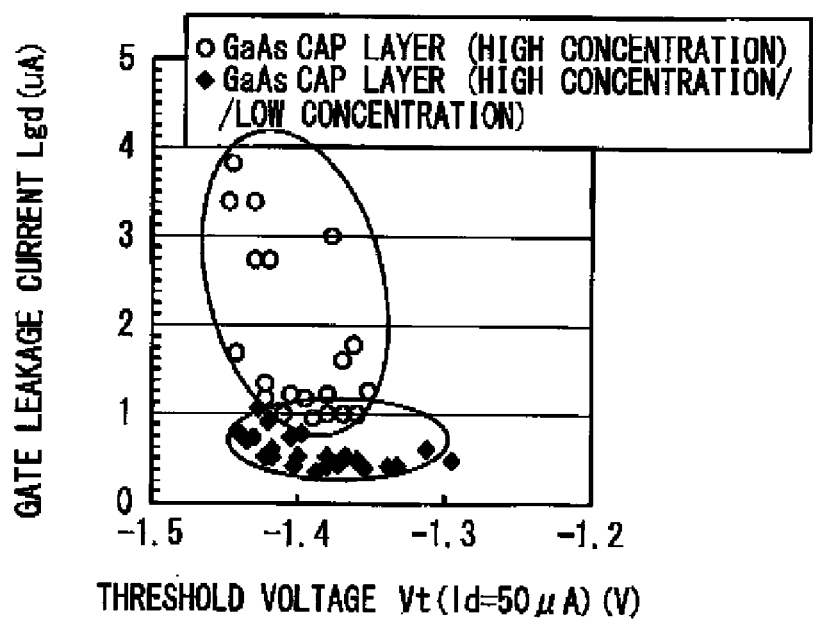
FIG. 6 is a diagram showing a gate leak current characteristic in the field-effect transistor according to the first embodiment.
Figure 7:
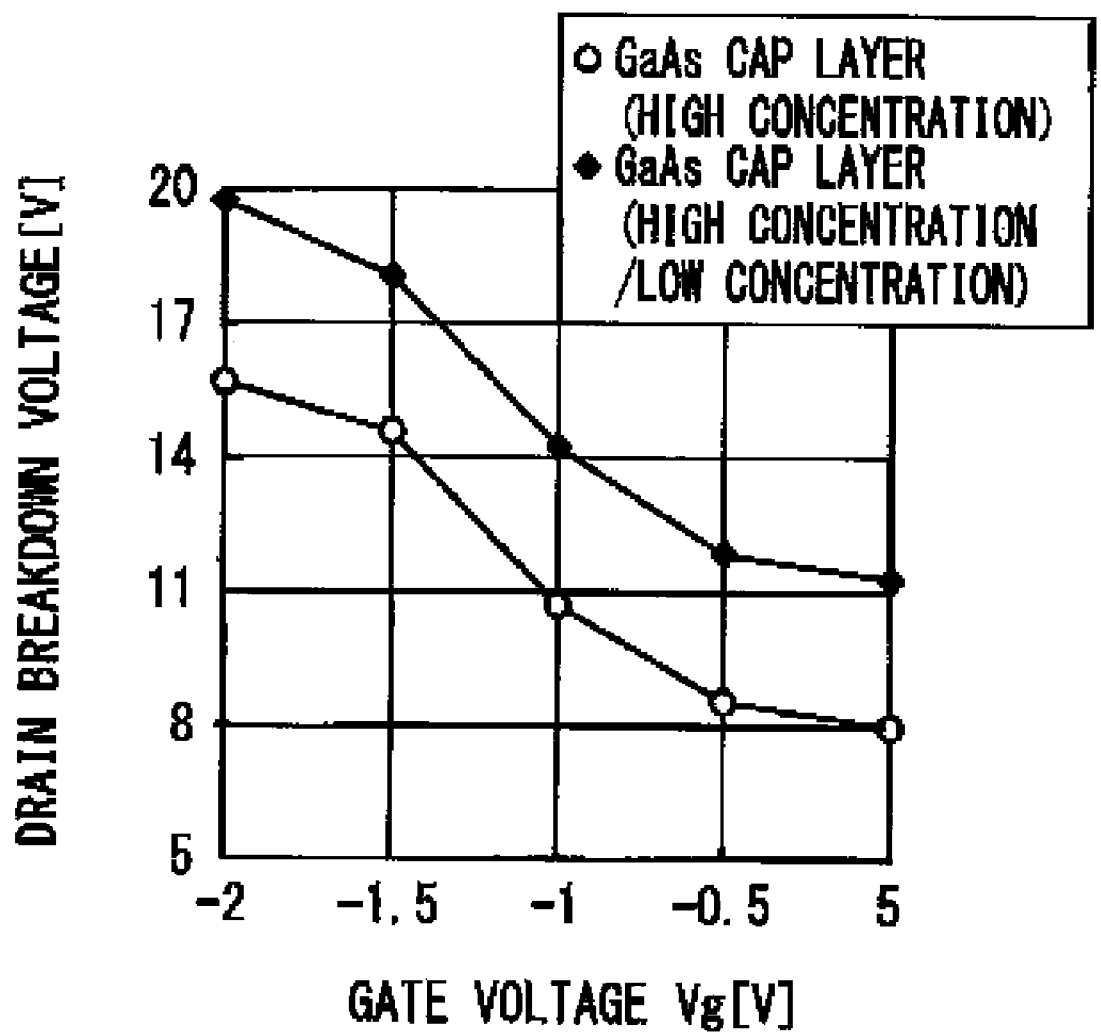
FIG. 7 is a diagram showing a drain breakdown voltage characteristic in the field-effect transistor according to the first embodiment.

Referring to FIG. 4, the field-effect transistor according to the present embodiment generates interface charge in the undoped InGaP stopper layer 9. A potential band in the undoped AlGaAs layer 8 is lowered by using the interface charge. In addition, in the boundary between the undoped InGaP stopper layer 9 and the GaAs cap layer (Si-doped GaAs cap layer (low concentration) 11), a potential band diagram shown by a dashed line in FIG. 4 is accordingly turned into a potential band shown by a solid line by including the high concentration Si-doped GaAs carrier compensation layer (high concentration) 10, and can be lowered. A device characteristic of the field-effect transistor according to the present embodiment will be described below. FIG. 5 shows an on-resistance characteristic of the field-effect transistor according to the present embodiment. FIG. 6 shows a gate leakage current characteristic of the field-effect transistor according to the present embodiment. FIG. 7 shows a drain breakdown voltage characteristic of the field-effect transistor according to the present embodiment. It should be noted that in FIGS. 5 to 7, a characteristic of a device structure in which the impurity of $4.0 \times 10^{18}$ cm$^{-3}$ is added into the GaAs cap layer is specified to simplify understanding of the field-effect transistor according to the present embodiment. Referring to FIGS. 5 to 7, the on-resistance slightly becomes wrong because a low concentration layer is inserted into the GaAs cap layer, but the low on-resistance of 1.2 Ω·mm is attained. Moreover, the effect of reduction of the gate leakage current can be attained due to the low concentration layer. In addition, a drain breakdown voltage to each gate voltage is dramatically improved.

[Second Embodiment]

Figure 8:
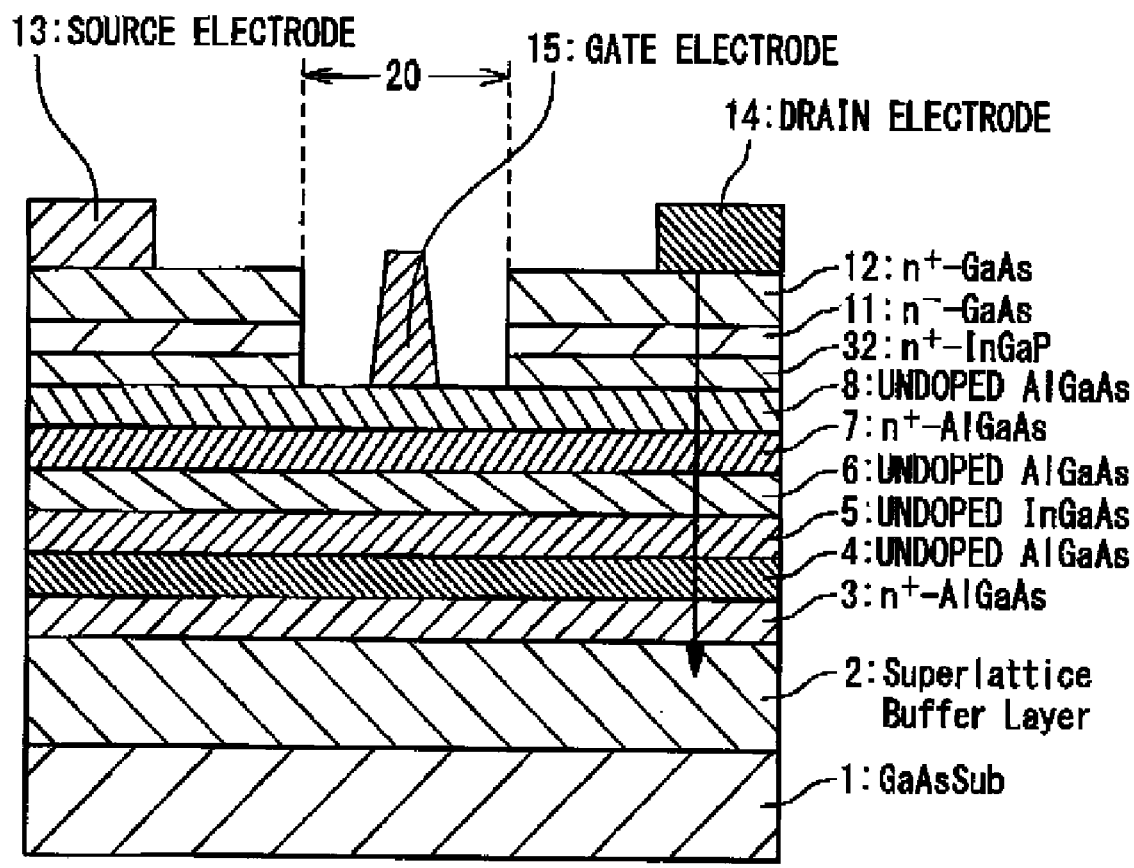
FIG. 8 is a cross-sectional view of a field-effect transistor according to a second embodiment of the present invention.

The field-effect transistor in a second embodiment of the present invention will be described below with reference to the drawings. FIG. 8 is a cross-sectional view showing a cross-section of the field-effect transistor according to the second embodiment. The epitaxial wafer of the field-effect transistor according to the second embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, the undoped AlGaAs layer 8, an InGaP (hereinafter, to be referred to as disorder-InGaP) stopper layer 32 in which an Si-doped spontaneous superlattice is not formed, the Si-doped GaAs cap layer (low concentration) 11, and the Si-doped GaAs cap layer (high concentration) 12.

The buffer layer 2 is formed on the semi-insulating GaAs substrate 1 to have the film thickness of approximately 800 nm. The Si-doped AlGaAs electron supply layer 3 is formed on the buffer layer 2 to have the film thickness of approximately 5 nm. The Si-doped AlGaAs electron supply layer 3 contains Si impurity of approximately $2.3 \times 10^{18}$ cm$^{-3}$. The undoped AlGaAs layer 4 is formed on the Si-doped AlGaAs electron supply layer 3 to have the film thickness of approximately 2 nm. The undoped AlGaAs layer 4 is formed without being intentionally added with any impurity. The undoped InGaAs channel layer 5 is formed on the undoped AlGaAs layer 4 to have the film thickness of approximately 15 nm. The undoped InGaAs channel layer 5 is formed without being intentionally added with any impurity. The undoped AlGaAs layer 6 is formed on the undoped InGaAs channel layer 5 to have the film thickness of approximately 2 nm. The undoped AlGaAs layer 6 is formed to have the film thickness of approximately 2 nm. The Si-doped AlGaAs electron supply layer 7 is formed on the undoped AlGaAs layer 6 to have the film thickness of approximately 13 nm. The Si-doped AlGaAs electron supply layer 7 contains Si impurity of approximately $2.3 \times 10^{18}$ cm$^{-3}$. The undoped AlGaAs layer 8 is formed on the Si-doped AlGaAs electron supply layer 7 to have the film thickness of approximately 29 nm. The undoped AlGaAs layer 8 is formed without being intentionally added with any impurity. The Si-doped disorder-InGaP stopper layer 32 is formed on the undoped AlGaAs layer 8 to have the film thickness of approximately 10 nm. The Si-doped disorder-InGaP stopper layer 32 contains Si impurity of approximately $1.0 \times 10^{19}$ cm$^{-3}$. The Si-doped GaAs cap layer (low concentration) 11 is formed on the Si-doped disorder-InGaP stopper layer 32 to have the film thickness of approximately 100 nm. The Si-doped GaAs cap layer (low concentration) 11 contains Si impurity of approximately $4.0 \times 14^{17}$ cm$^{-3}$. The Si-doped GaAs cap layer (high concentration) 12 is formed on the Si-doped GaAs cap layer (low concentration) 11 to have the film thickness of approximately 50 nm. The Si-doped GaAs cap layer (high concentration) 12 contains Si impurity of approximately $4.0 \times 10^{18}$ cm$^{-3}$.

Additionally, like the first embodiment, the field-effect transistor according to the second embodiment has the source electrode 13, the drain electrode 14, and the Ti—Al gate electrode 15. As shown in FIG. 8, the source electrode 13 includes a Ni—AuGe—Au alloy layer. The drain electrode 14 includes the Ni—AuGe—Au alloy layer. In addition, the Ti—Al gate electrode 15 is arranged in the gate opening 20. A recess portion corresponding to the gate opening 20 is formed by etching the Si-doped GaAs cap layer (high concentration) 12 and the Si-doped GaAs cap layer (low concentration) 11 in the GaAs cap layer, and by further etching the Si-doped disorder-InGaP stopper layer 32. The Ti—Al gate electrode 15 contacts a bottom surface of the recess portion to constitute the field-effect transistor.

The field-effect transistor according to the second embodiment has a single recess structure having a high concentration region, a low concentration region, and the Si-doped disorder-InGaP stopper layer 32 by changing the concentration of Si impurity in the GaAs cap layer.

Figure 9:
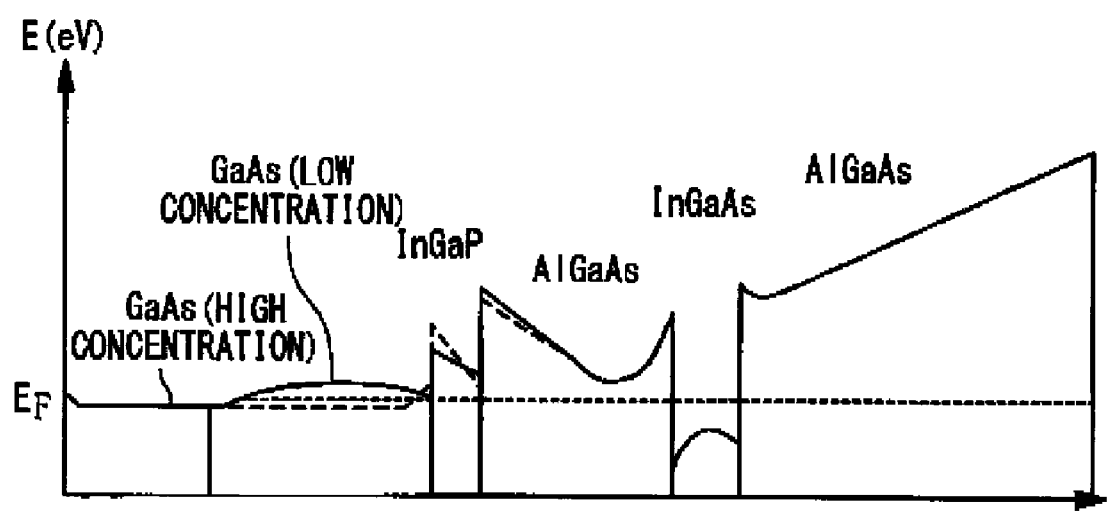
FIG. 9 is a diagram of a potential band from a cap layer to a channel layer in the field-effect transistor according to the second embodiment.

FIG. 9 is a potential band diagram from the cap layer to the channel layer in the field-effect transistor according to the second embodiment. In FIG. 7, a dashed line shows a potential band diagram of the field-effect transistor using the order-InGaP stopper layer without forming the Si-doped GaAs carrier compensation layer (high concentration) 10. The first embodiment realizes reduction of the potential barrier by positively using the interface charge of the order-InGaP stopper layer. In the second embodiment, a solid line shows a potential band diagram in which the undoped AlGaAs layer 8 is lowered due to a structure that Si-impurity is doped into the InGaP layer whose interface charge is suppressed. Moreover, interface charge of the InGaP is not generated in an interface between the Si-doped disorder-InGaP stopper layer 32 and the GaAs cap layer. Accordingly, in the second embodiment, the field-effect transistor can be constituted without forming the above-described Si-doped GaAs carrier compensation layer (high concentration) 10.

Additionally, the impurity can be added into the InGaP layer up to approximately $1.0 \times 10^{18}$ cm$^{-3}$ while impurity can be added into the GaAs layer up to approximately $4.0 \times 10^{18}$ cm$^{-3}$. Thus, the disorder-InGaP stopper layer into which Si impurity is doped can lower the potential band. In this manner, a high breakdown voltage, a low gate leakage current, and a low on-resistance of 1.2 Ω·mm can be attained.

[Third Embodiment]

Figure 10:
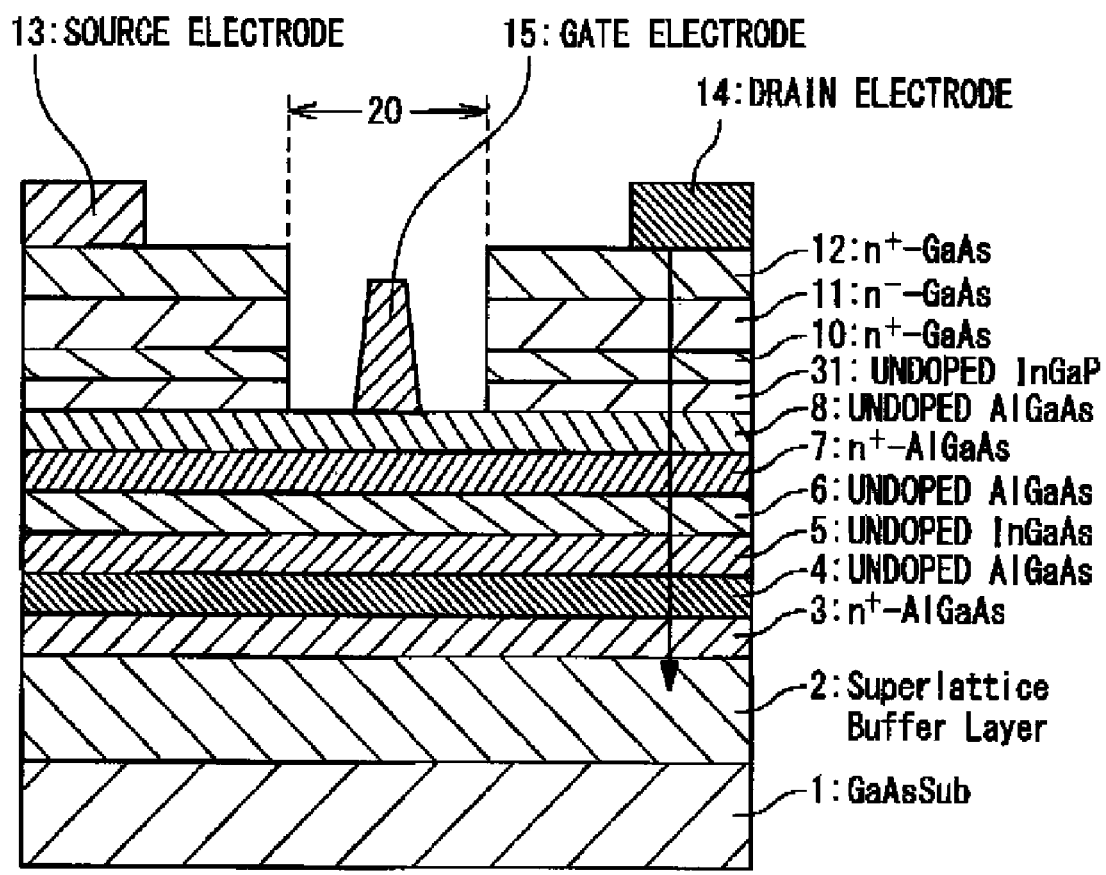
FIG. 10 is a cross-sectional view of a field-effect transistor according to a third embodiment of the present invention.

The field-effect transistor according to a third embodiment of the present invention will be described below with reference to the attached drawings. FIG. 10 is a cross-sectional view showing a structure of the field-effect transistor according to the third embodiment. The epitaxial wafer of the field-effect transistor according to the third embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, the undoped AlGaAs layer 8, an undoped disorder-InGaP stopper layer 31, the Si-doped GaAs carrier compensation layer (high concentration) 10, the Si-doped GaAs cap layer (low concentration) 11, and the Si-doped GaAs cap layer (high concentration) 12.

The undoped disorder-InGaP stopper layer 31 is formed to have the film thickness of approximately 10 nm. The undoped disorder-InGaP stopper layer 31 is formed without being intentionally added with any impurity. Here, the undoped disorder-InGaP stopper layer 31 is an InGaP layer in which a spontaneous superlattice is not formed. The Si-doped GaAs carrier compensation layer (high concentration) 10 is provided on the undoped disorder-InGaP stopper layer 31. The Si-doped GaAs carrier compensation layer (high concentration) 10 is formed so as to contain the si-impurity of approximately $3.0 \times 10^{18}$ cm$^{-3}$. The Si-doped GaAs carrier compensation layer (high concentration) 10 is formed to have the film thickness of approximately 5 nm.

The field-effect transistor according to the third embodiment can attain the same effect as that of the field-effect transistor according to the first embodiment or the second embodiment by combining the carrier compensation layer with the InGaP layer.

[Fourth Embodiment]

Figure 11:
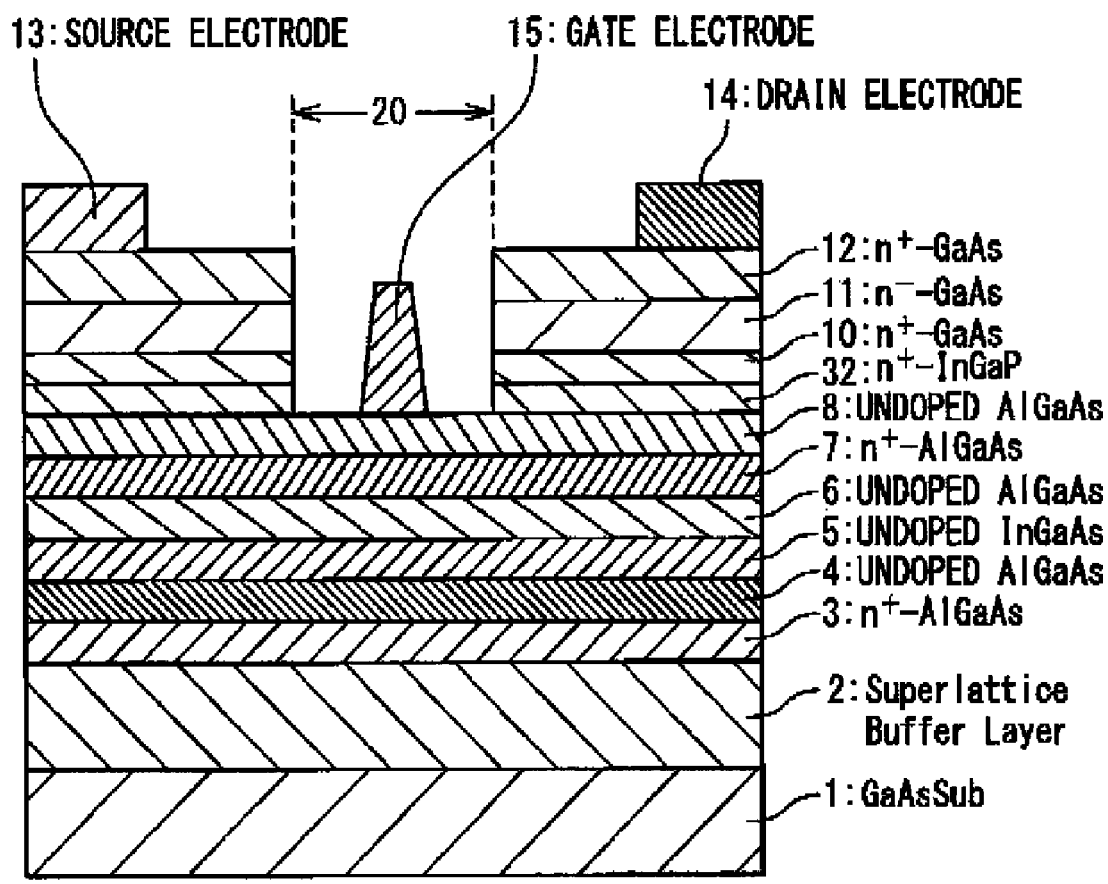
FIG. 11 is a cross-sectional view of a field-effect transistor according to a fourth embodiment of the present invention.

The field-effect transistor according to a fourth embodiment of the present invention will be described below with reference to the attached drawings. FIG. 11 is a cross-sectional view showing the structure of the field-effect transistor according to the fourth embodiment. The epitaxial wafer of the field-effect transistor according to the fourth embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply, layer 7, the undoped AlGaAs layer 8, the Si-doped disorder-InGaP stopper layer 32, the Si-doped GaAs carrier compensation layer (high concentration) 10, the Si-doped GaAs cap layer (low concentration) 11, and the Si-doped GaAs cap layer (high concentration) 12.

As described above, the Si-doped disorder-InGaP stopper layer 32 is formed on the undoped AlGaAs layer 8 to have the film thickness of approximately 10 nm. The Si-doped disorder-InGaP stopper layer 32 contains Si-impurity of approximately $1.0 \times 10^{18}$ cm$^{-3}$. The Si-doped disorder-InGaP stopper layer 32 is an InGaP layer in which a Si-doped spontaneous superlattice is not formed. The Si-doped GaAs carrier compensation layer (high concentration). 10 is provided on the Si-doped disorder-InGaP stopper layer 32. The Si-doped GaAs carrier compensation layer (high concentration) 10 is formed so as to contain Si-impurity of approximately $3.0 \times 10^{18}$ cm$^{-3}$. The Si-doped GaAs carrier compensation layer (high concentration) 10 is formed to have the film thickness of approximately 5 nm.

The field-effect transistor according to the fourth embodiment can attain the same effect as that of the field-effect transistor according to the first embodiment or the second embodiment by combining the carrier compensation layer with the InGaP layer.

[Fifth Embodiment]

Figure 12:
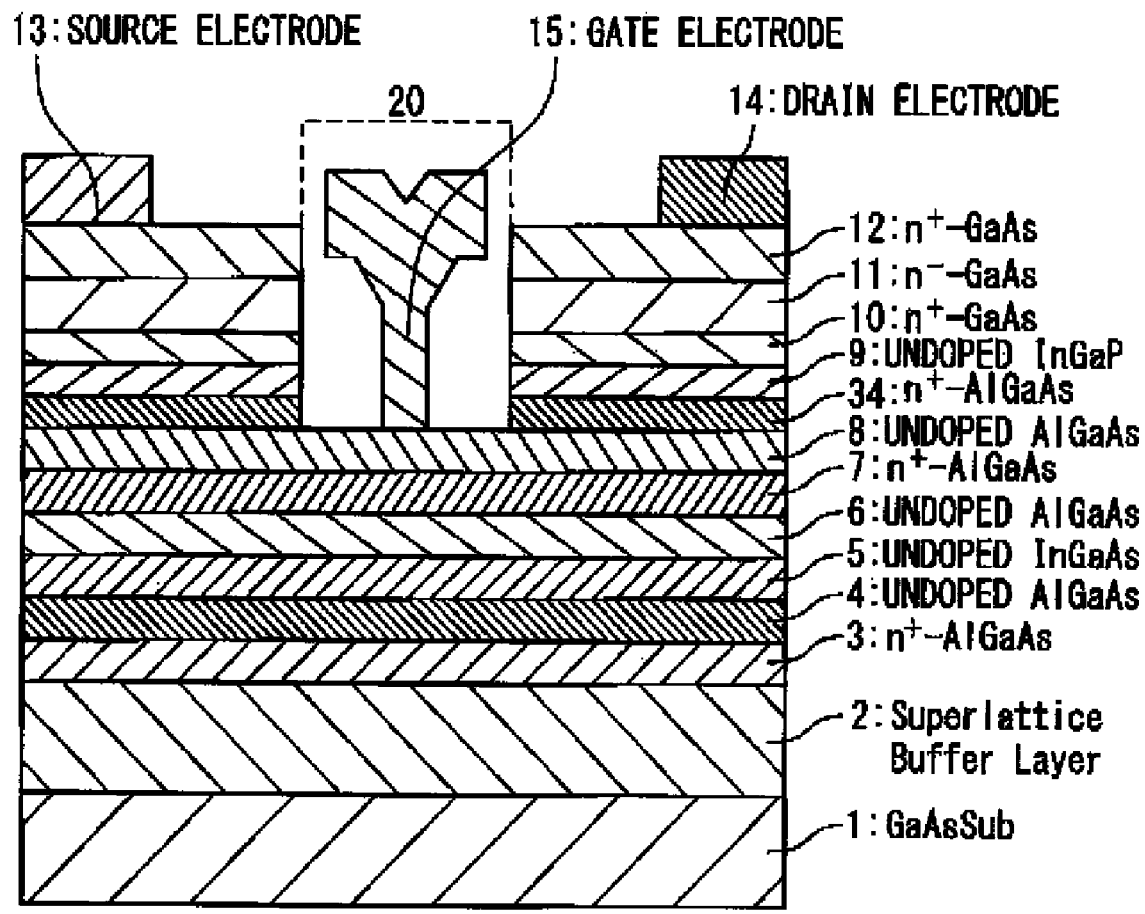
FIG. 12 is a cross-sectional view of a field-effect transistor according to a fifth embodiment of the present invention.

The field-effect transistor according to a fifth embodiment of the present invention will be described below with reference to the attached drawings. In the above-described embodiments, Si-impurity is not added into the undoped AlGaAs layer 8 which the Ti—Al gate electrode 15 contacts. The epitaxial structure into which Si-impurity is added also attains the effect of reduction of the on-resistance. FIG. 12 is a cross-sectional view showing the structure of the field-effect transistor according to the fifth embodiment. The epitaxial wafer of the field-effect transistor according to the fifth embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, the undoped AlGaAs layer 8, the Si-doped AlGaAs layer (high concentration) 34, the undoped order-InGaP stopper layer 9, the Si-doped GaAs carrier compensation layer (high concentration) 10, the Si-doped GaAs cap layer (low concentration) 11, and the Si-doped GaAs cap layer (high concentration) 12. In addition, the field-effect transistor according to the fifth embodiment has a WSi gate electrode 16.

The field-effect transistor according to the fifth embodiment has the Si-doped AlGaAs layer (high concentration) 34 on an undoped AlGaAs layer 8 in an interface between the undoped AlGaAs layer 8 and the undoped order-InGaP stopper layer 9. The Si-doped AlGaAs layer (high concentration) 34 has the thickness of a few nanometers, and Si-impurity is added in a high concentration. When the undoped InGaP stopper layer 9 is etched, the surface layer of a few nanometers of the undoped AlGaAs layer 8 is removed. For this reason, a semiconductor interface which a WSi gate electrode 16 contacts is the undoped AlGaAs layer 8 that does not contain any impurity, and the cap layer portion is an AlGaAs layer including the Si-doped AlGaAs layer (high concentration) 34. Accordingly, the effect of reduction of an on-resistance can be attained without deteriorating a gate leakage current.

[Sixth Embodiment]

Figure 13:
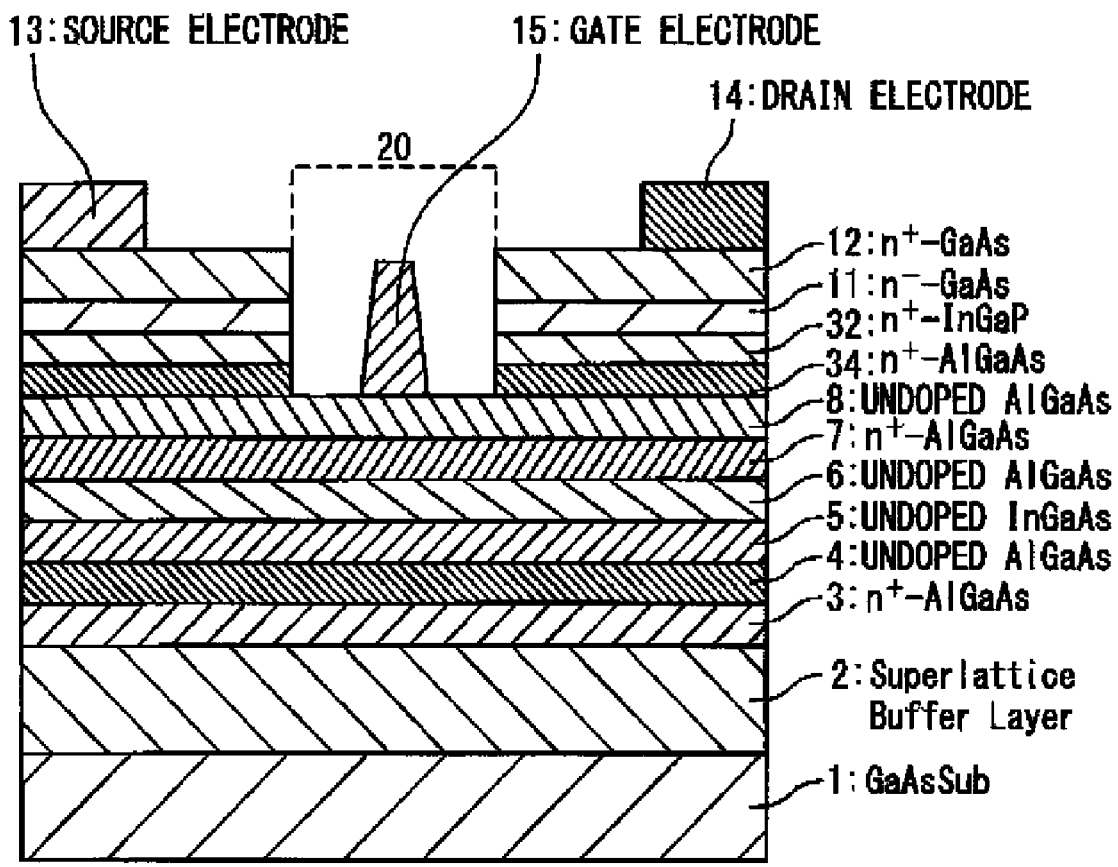
FIG. 13 is a cross-sectional view of a field-effect transistor according to a sixth embodiment of the present invention.

The field-effect transistor according to a sixth embodiment of the present invention will be described below with reference to the drawings. FIG. 13 is a cross-sectional view showing the structure of the field-effect transistor according to the sixth embodiment. The epitaxial wafer of the field-effect transistor according to the sixth embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, the undoped AlGaAs layer 8, the Si-doped AlGaAs layer (high concentration) 34, the Si-doped disorder-InGaP stopper layer 32, the Si-doped GaAs cap layer (low concentration) 11, and the Si-doped GaAs cap layer (high concentration) 12.

The field-effect transistor according to the sixth embodiment has the Si-doped AlGaAs layer (high concentration) 34 on a surface layer of the undoped AlGaAs layer 8 in an interface between the undoped AlGaAs layer 8 and the Si-doped disorder-InGaP stopper layer 32. The Si-doped AlGaAs layer (high concentration) 34 has the thickness of a few nanometers, and Si-impurity is added in high concentration. When the undoped order-InGaP stopper layer 9 is etched, the surface layer, having a few nanometers, of the undoped AlGaAs layer 8 is removed. In this manner, a semiconductor interface which the Ti—Al gate electrode 15 contacts becomes the undoped AlGaAs layer 8 that does not contain impurity, and the cap layer portion becomes an AlGaAs layer including the Si-doped AlGaAs layer (high concentration) 34. Accordingly, the effect of reduction of an on-resistance can be attained without deteriorating a gate leak current.

[Seventh Embodiment]

Figure 14:
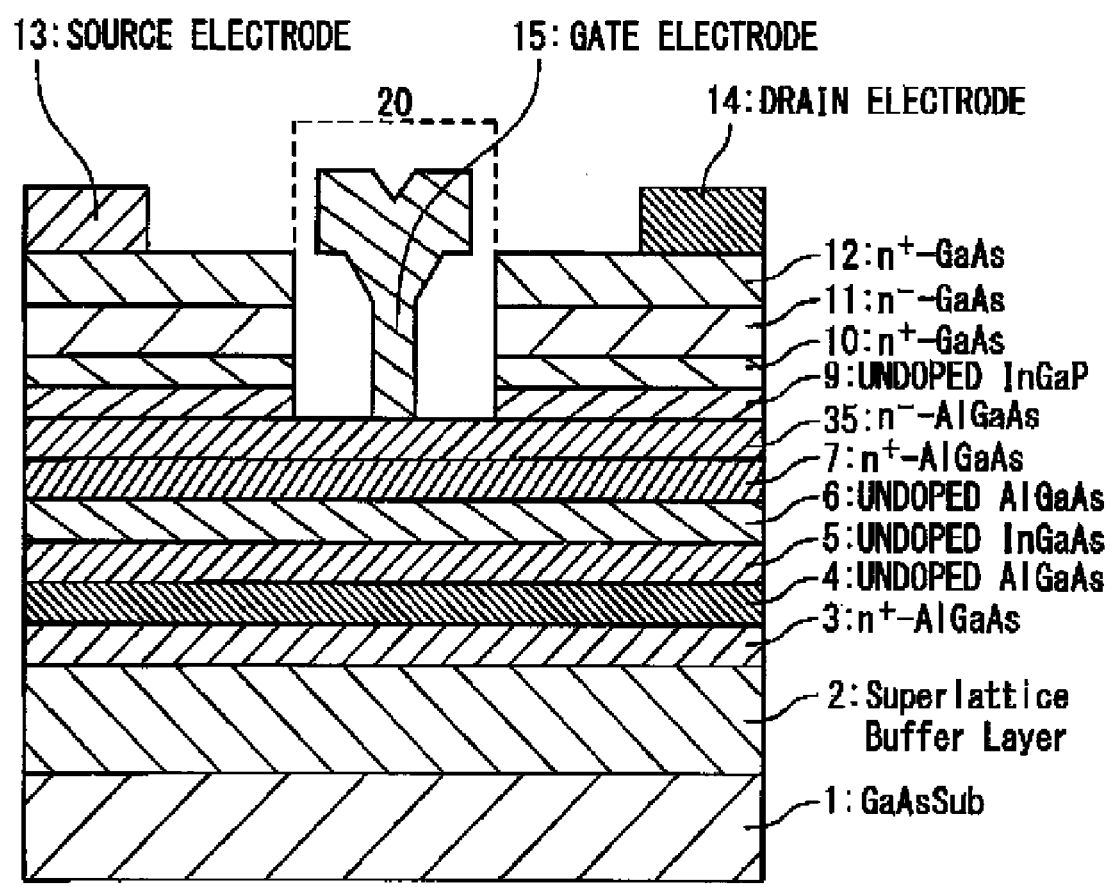
FIG. 14 is a cross-sectional view of a field-effect transistor according to a seventh embodiment of the present invention.

The field-effect transistor according to a seventh embodiment of the present invention will be described below with reference to the drawings. FIG. 14 is a cross-sectional view showing the structure of the field-effect transistor according to the seventh embodiment. The epitaxial wafer of the field-effect transistor according to the seventh embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, an Si-doped AlGaAs layer (low concentration) 35, the undoped order-InGaP stopper layer 9, the Si-doped GaAs carrier compensation layer (high concentration) 10, the Si-doped GaAs cap layer (low concentration) 11, and the Si-doped GaAs cap layer (high concentration) 12. In addition, the field-effect transistor according to the seventh embodiment has the WSi gate electrode 16.

In the Si-doped AlGaAs layer (low concentration) 35, Si-impurity is added in low concentration throughout the AlGaAs layer. The WSi gate electrode 16 contacts the Si-doped AlGaAs layer (low concentration) 35 in the gate opening 20. The field-effect transistor according to the seventh embodiment can attain the effect of reduction of an on-resistance without increasing a gate leakage current due to the effect of the Si-doped AlGaAs layer (low concentration) 35.

[Eighth Embodiment]

Figure 15:
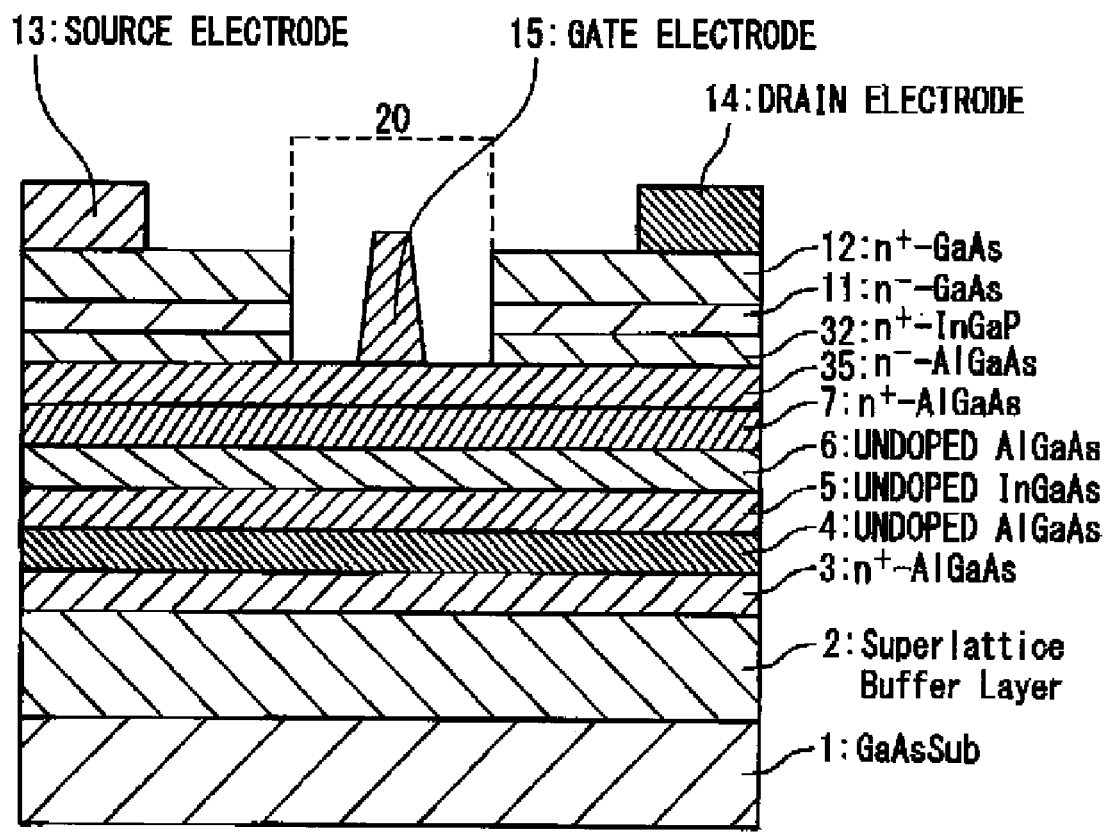
FIG. 15 is a cross-sectional view of a field-effect transistor according to an eighth embodiment of the present invention.

The field-effect transistor according to an eighth embodiment of the present invention will be described below with reference to the drawings. FIG. 15 is a cross-sectional view showing the structure of the field-effect transistor according to the eighth embodiment. The epitaxial wafer of the field-effect transistor according to the eighth embodiment includes the semi-insulating GaAs substrate 1, the buffer layer 2, the Si-doped AlGaAs electron supply layer 3, the undoped AlGaAs layer 4, the undoped InGaAs channel layer 5, the undoped AlGaAs layer 6, the Si-doped AlGaAs electron supply layer 7, the Si-doped AlGaAs layer (low concentration) 35, the Si-doped disorder-InGaP stopper layer 32, the Si-doped GaAs cap layer (low concentration) 11, and the Si-doped GaAs cap layer (high concentration) 12.

In the Si-doped AlGaAs layer (low concentration) 35, Si-impurity is added in low concentration throughout the AlGaAs layer in the same manner as that of the field-effect transistor according to the seventh embodiment. The Ti—Al gate electrode 15 contacts the Si-doped AlGaAs layer (low concentration) 35 in the gate opening 20. The field-effect transistor according to the seventh embodiment can attain the effect of reduction of an on-resistance without increasing a gate leakage current due to the effect of the Si-doped AlGaAs layer (low concentration) 35.

[Ninth Embodiment]

Figure 16:
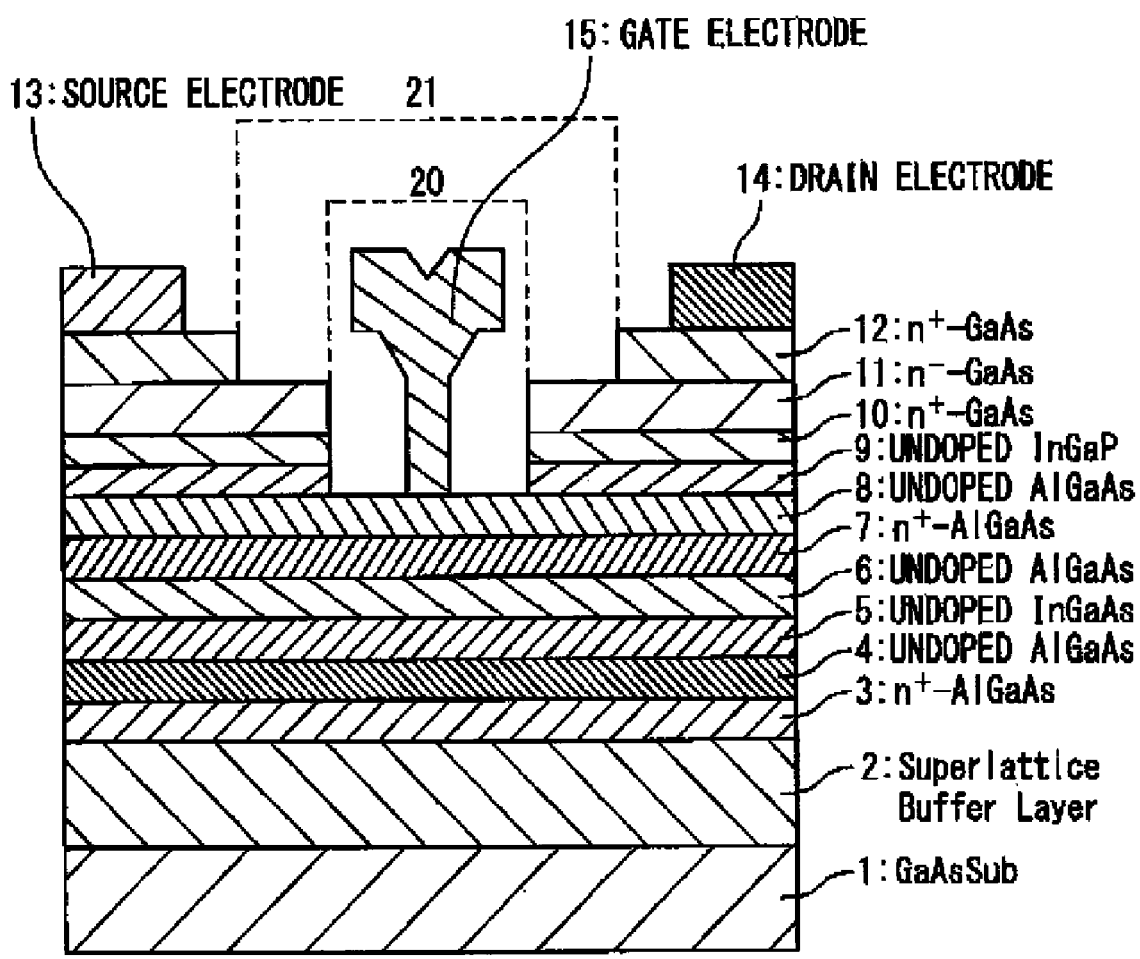
FIG. 16 is a cross-sectional view of a field-effect transistor according to a ninth embodiment of the present invention.
Figure 17:
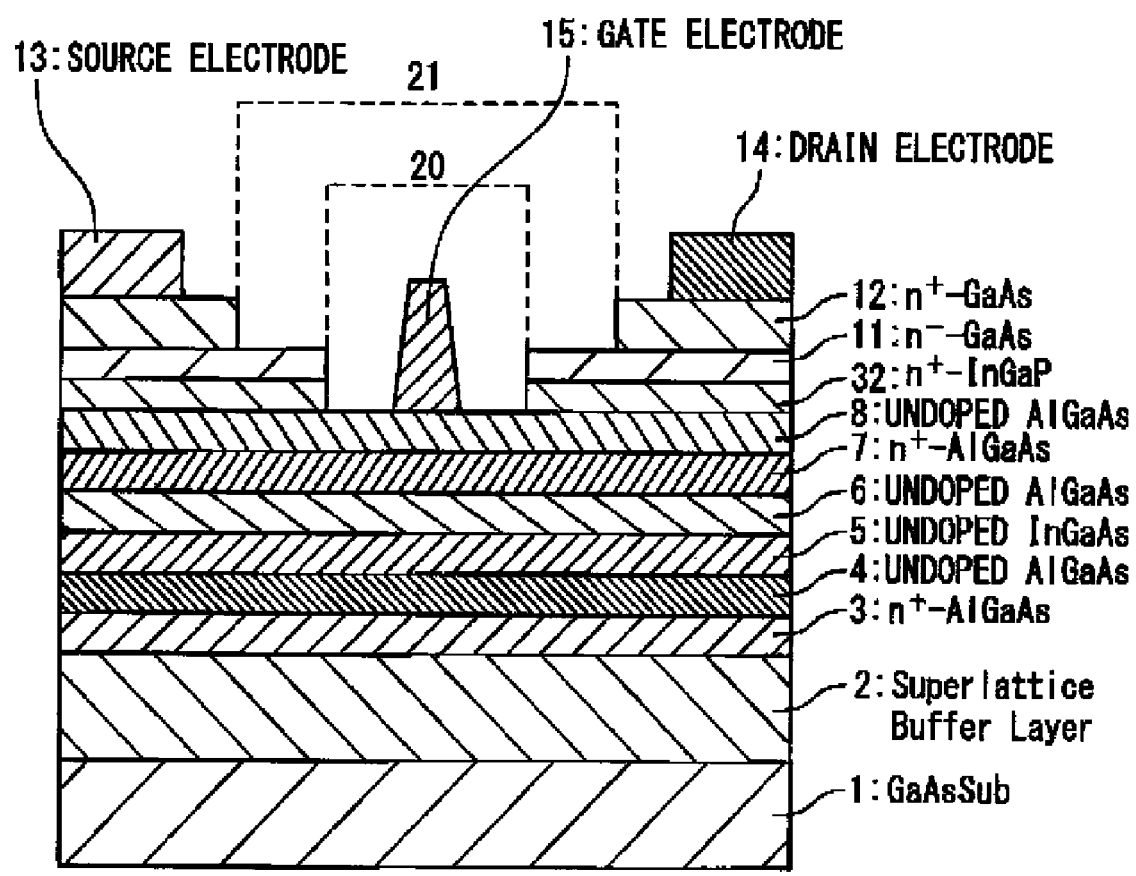
FIG. 17 is a cross-sectional view of the field-effect transistor according to the ninth embodiment.

The field-effect transistor according to a ninth embodiment of the present invention will be described below with reference to the drawings. FIG. 16 is a cross-sectional view showing the structure of the field-effect transistor according to the ninth embodiment. In addition, FIG. 17 is a cross-sectional view showing another configuration of the field-effect transistor according to the ninth embodiment. As shown in FIG. 16 or FIG. 17, the field-effect transistor according to the ninth embodiment has a wide recess 21 wider than the gate opening 20. A recess portion corresponding to the wide recess 21 is formed by etching the Si-doped GaAs cap layer (high concentration) 12 constituting the GaAs cap layer. A multistage recess structure with the wide recess 21 and the gate opening 20 realizes a high breakdown voltage and reduction of a parasitic resistance, and further realizes a low on-resistance, the effect of reduction of a gate leakage current, and an improvement of a drain breakdown voltage to each gate voltage.

[Tenth Embodiment]

Figure 18:
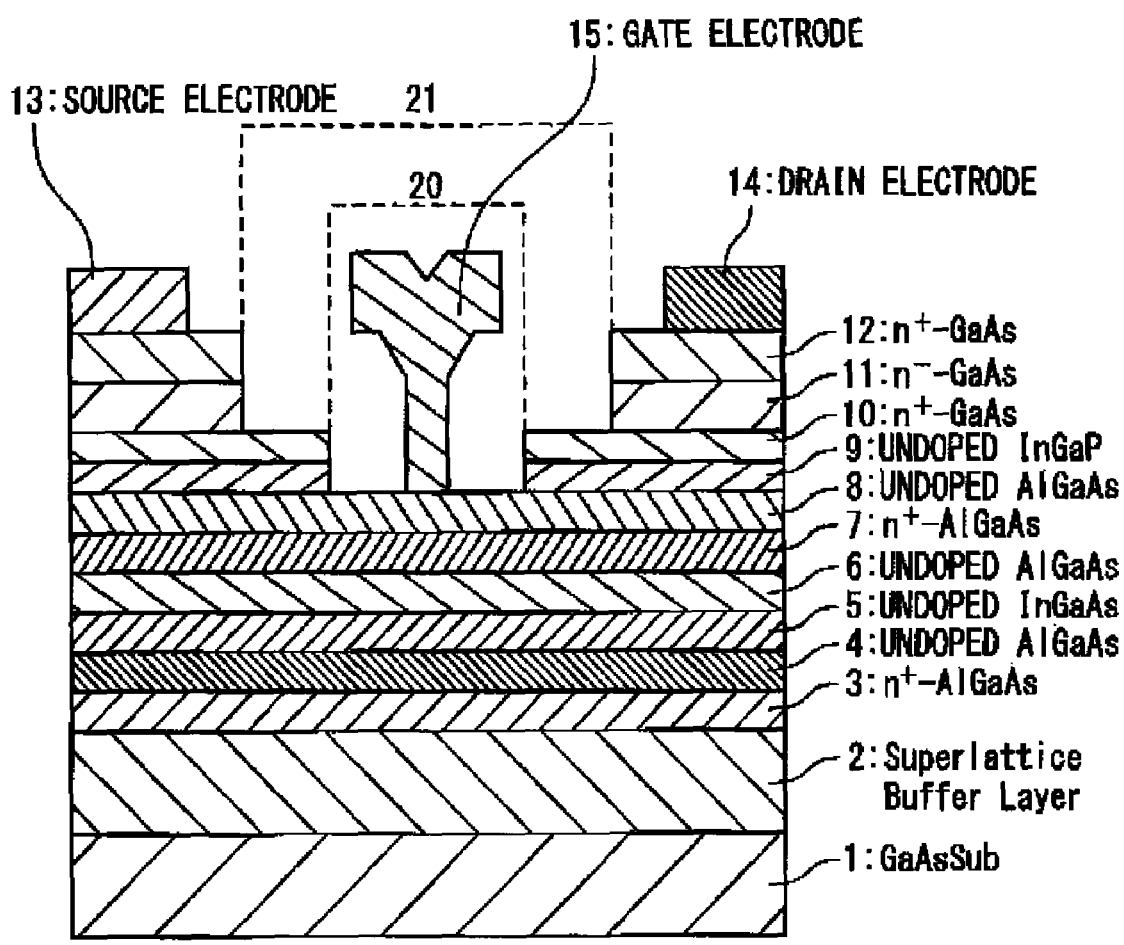
FIG. 18 is a cross-sectional view of a field-effect transistor according to a tenth embodiment of the present invention.
Figure 19:
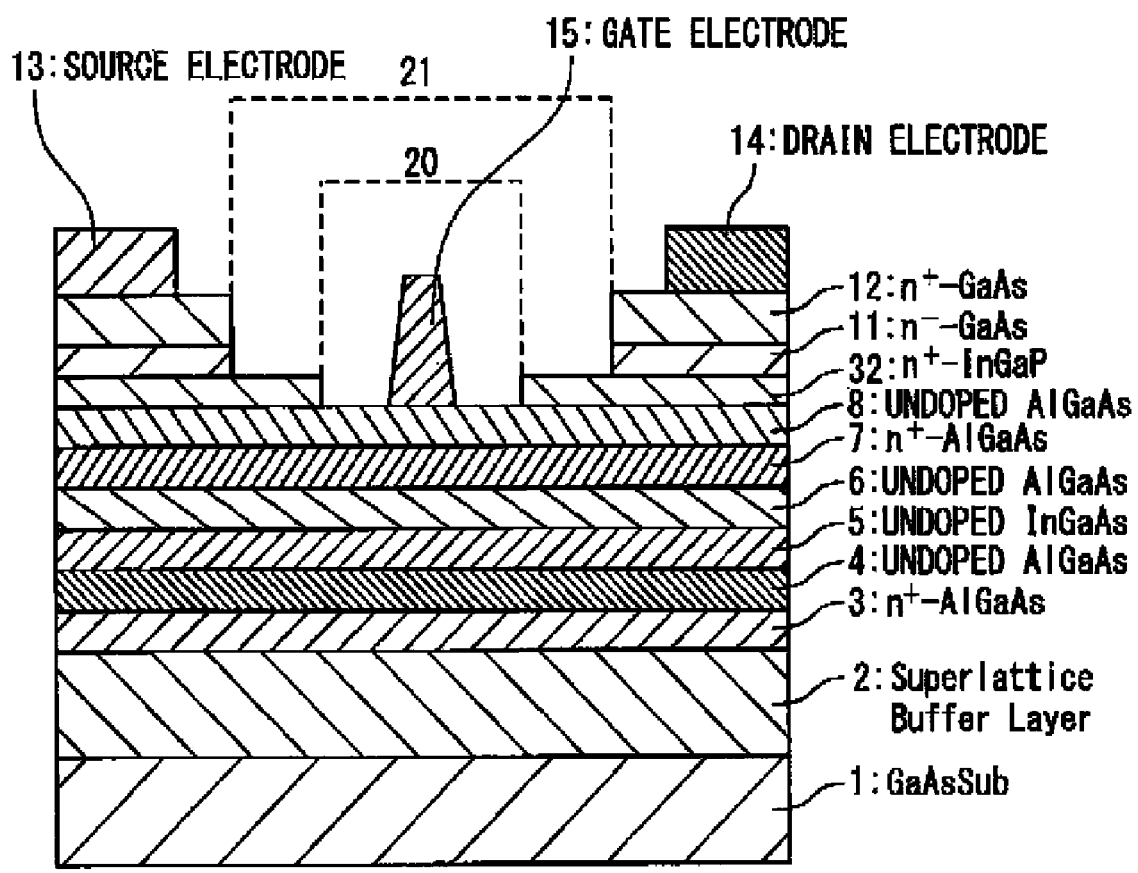
FIG. 19 is a cross-sectional view of the field-effect transistor according to the tenth embodiment.

The field-effect transistor according to a tenth embodiment of the present invention will be described below with reference to the drawings. FIG. 18 is a cross-sectional view showing the structure of the field-effect transistor according to the tenth embodiment. In addition, FIG. 19 is a cross-sectional view showing another structure of the field-effect transistor according to the tenth embodiment. As shown in FIG. 18 or FIG. 19, the field-effect transistor according to the tenth embodiment has the wide recess 21 wider than the gate opening 20. A recess portion corresponding to the wide recess 21 is formed by etching the Si-doped GaAs cap layer (high concentration) 12 and the Si-doped GaAs cap layer (low concentration) 11 in the GaAs cap layer. A multistage recess structure with the wide recess 21 and the gate opening 20 realizes a high breakdown voltage and reduction of a parasitic resistance, and further realizes a low on-resistance, the effect of reduction of a gate leakage current, and an improvement of a drain breakdown voltage to each gate voltage.

[Eleventh Embodiment]

Figure 20:
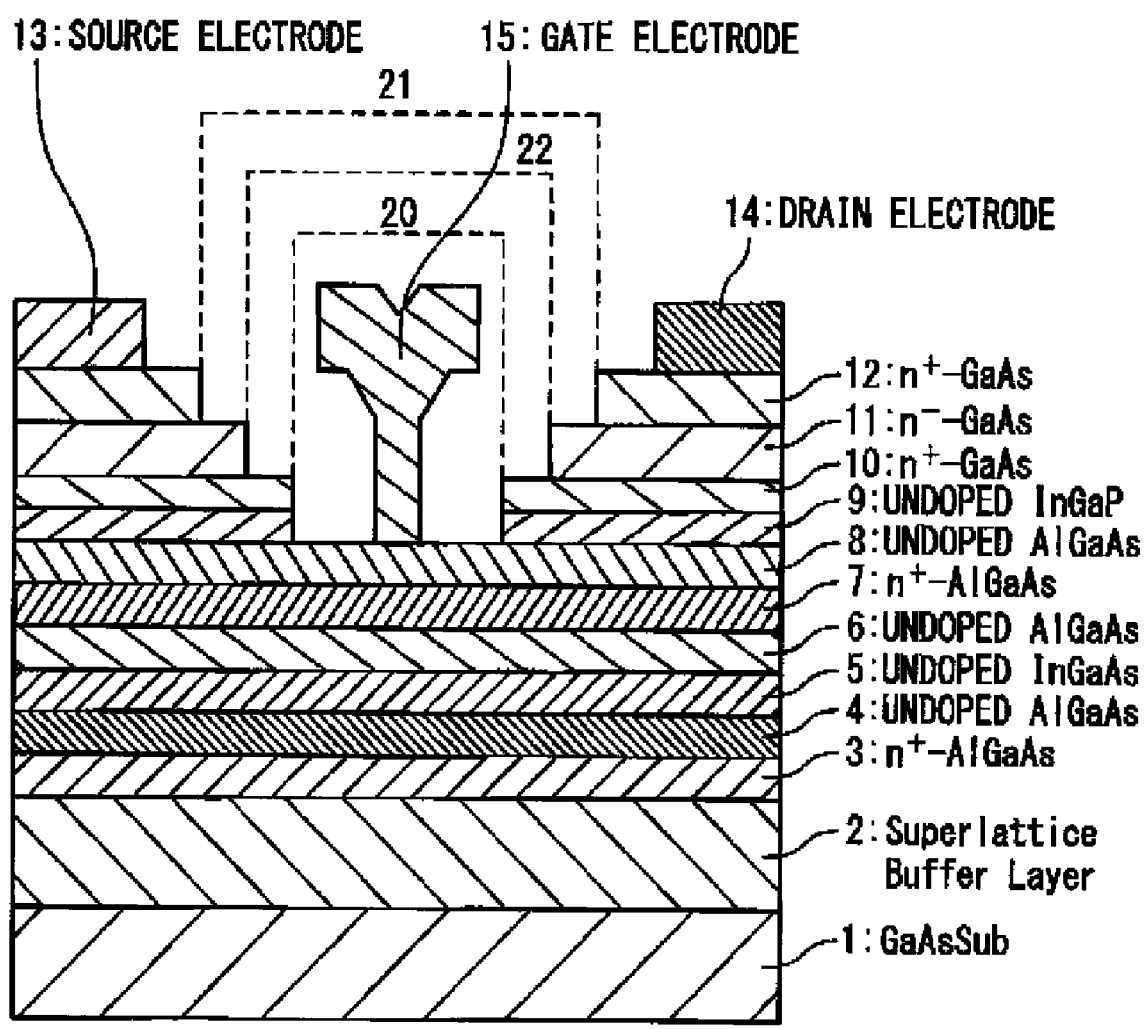
FIG. 20 is a cross-sectional view of a field-effect transistor according to an eleventh embodiment of the present invention.
Figure 21:
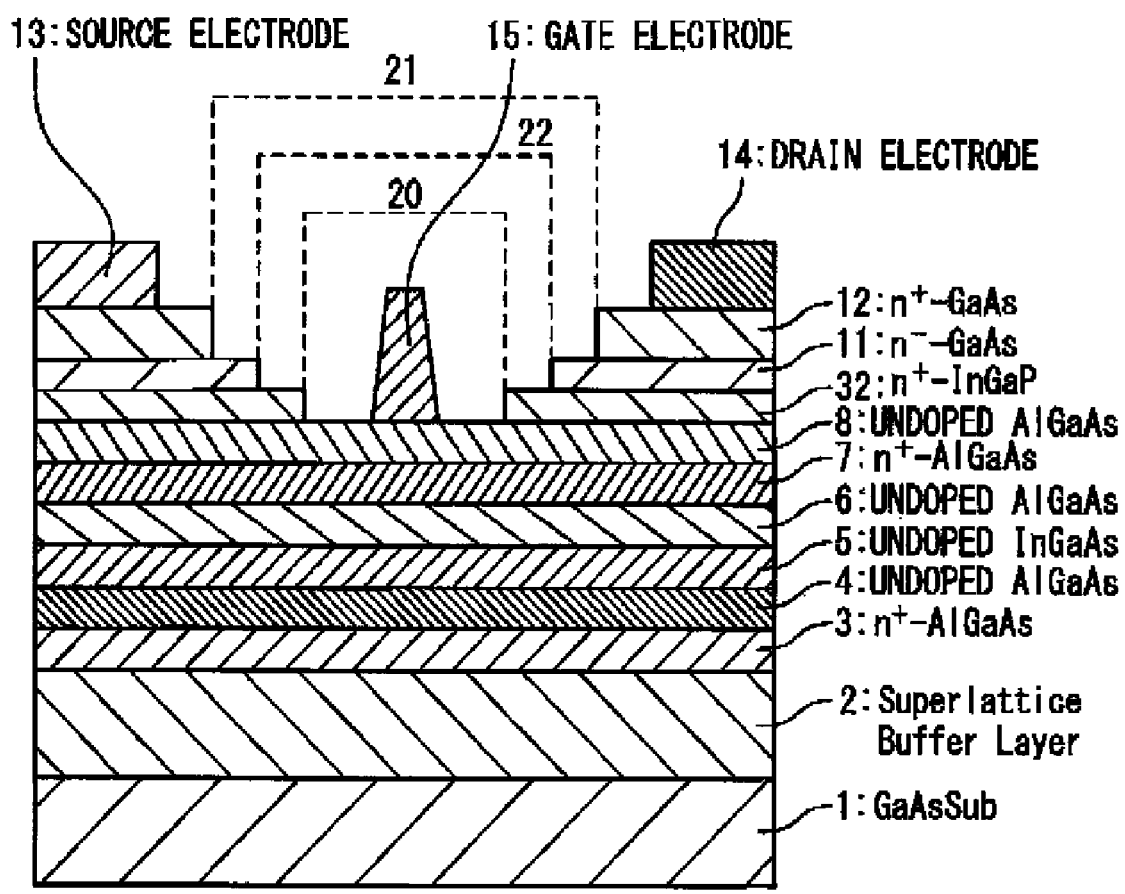
FIG. 21 is a cross-sectional view of the field-effect transistor according to the eleventh embodiment.

The field-effect transistor according to an eleventh embodiment of the present invention will be described below reference to the drawings. FIG. 20 is a cross-sectional view showing the structure of the field-effect transistor according to the eleventh embodiment. In addition, FIG. 21 is a cross-sectional view showing another structure of the field-effect transistor according to the eleventh embodiment. As shown in FIG. 20 or FIG. 21, the field-effect transistor according to the eleventh embodiment has a narrow recess 22 wider than the gate opening 20 and the wide recess 21 wider than the narrow recess 22. The wide recess 21 is formed by etching the Si-doped GaAs cap layer (high concentration) 12 constituting the GaAs cap layer in a width corresponding to the wide recess 21. The narrow recess 22 is formed by etching the Si-doped GaAs cap layer (low concentration) 11 of the GaAs cap layer in a width corresponding to the narrow recess 22. A multistage recess structure with the wide recess 21, the narrow recess 22, and the gate opening 20 realizes a high breakdown voltage and reduction of a parasitic resistance, and further realizes a low on-resistance, the effect of reduction of a gate leakage current, and an improvement of a drain breakdown voltage to each gate voltage.

[Twelfth Embodiment]

Figure 22:
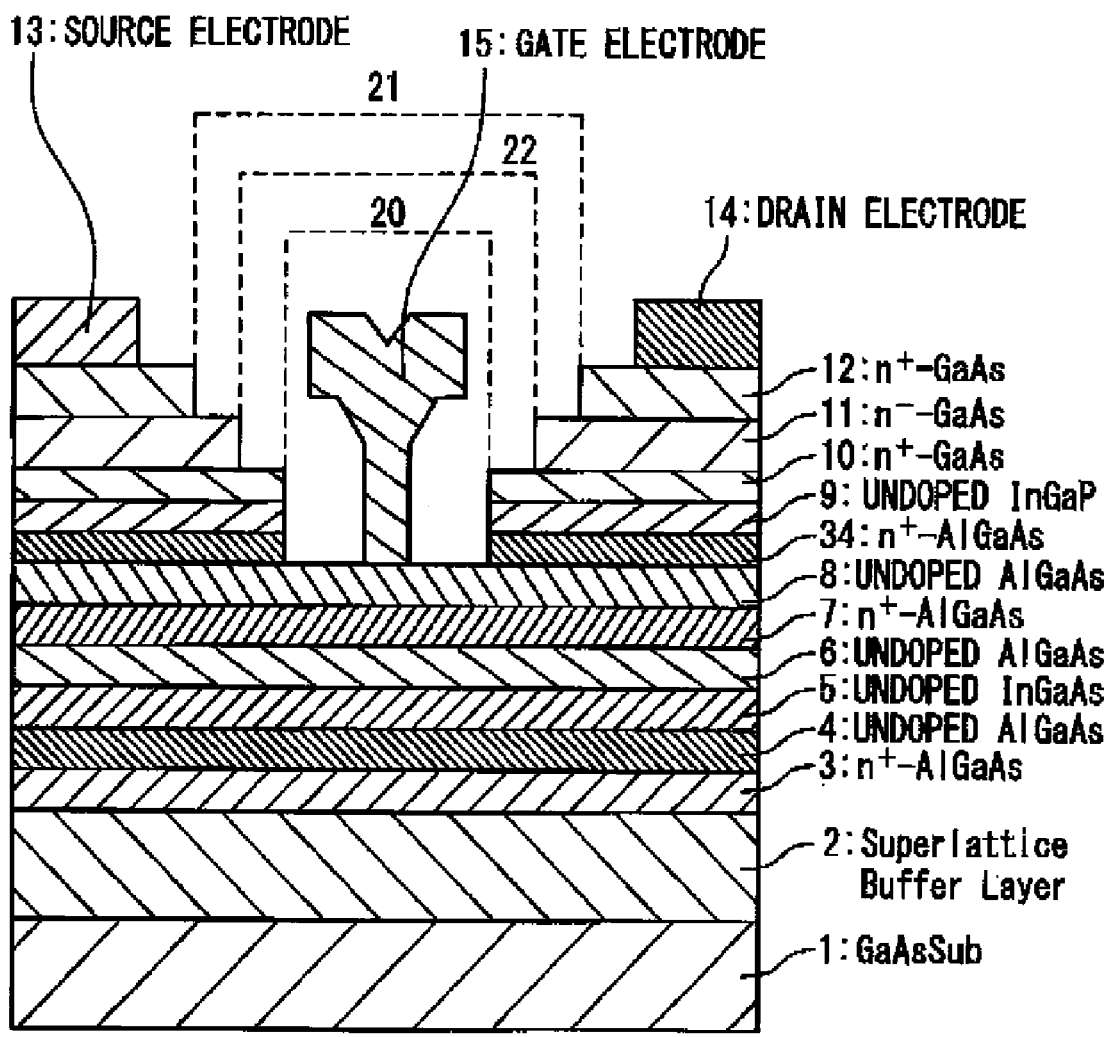
FIG. 22 is a cross-sectional view of a field-effect transistor according to a twelfth embodiment of the present invention.
Figure 23:
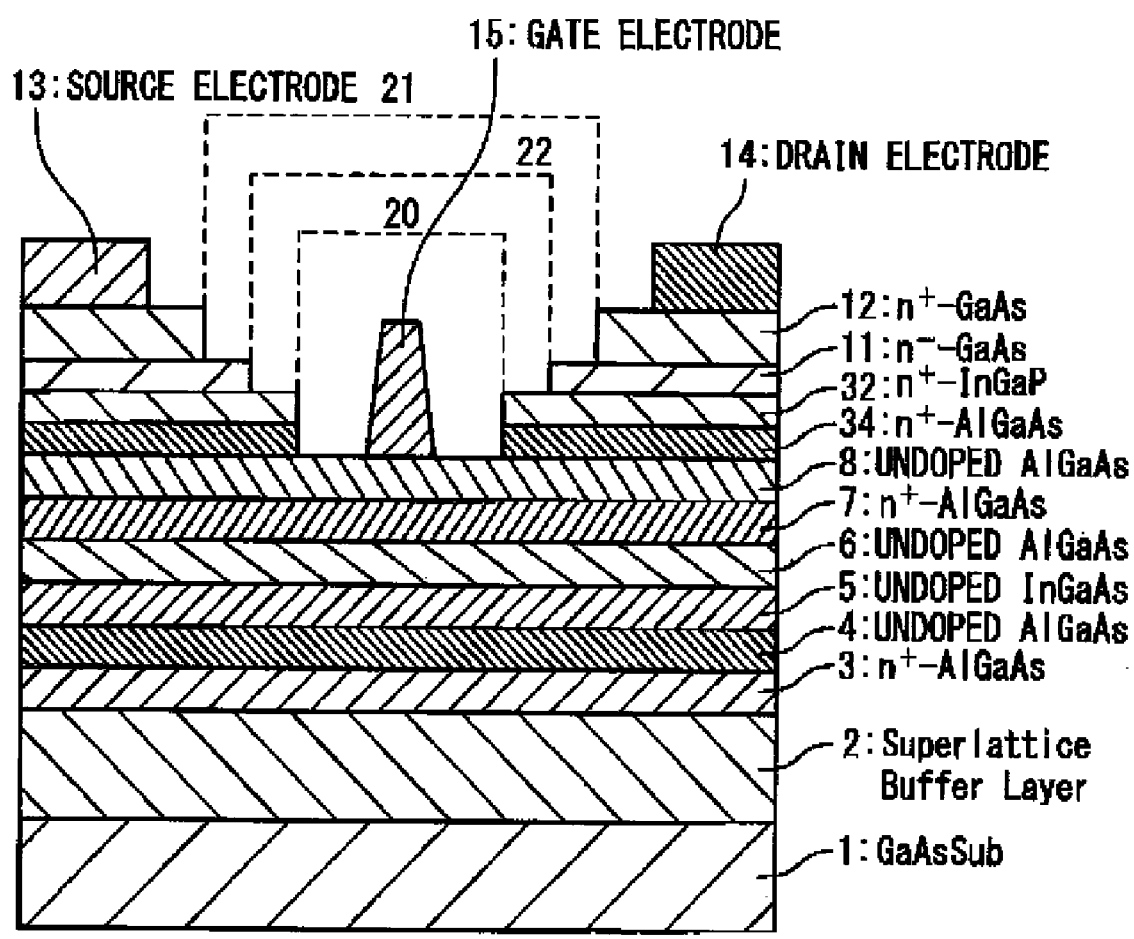
FIG. 23 is a cross-sectional view of the field-effect transistor according to the twelfth embodiment.

The field-effect transistor according to a twelfth embodiment of the present invention will be described below with reference to the drawings. FIG. 22 is a cross-sectional view showing the structure of the field-effect transistor according to the twelfth embodiment. In addition, FIG. 23 is a cross-sectional view showing another structure of the field-effect transistor according to the twelfth embodiment. As shown in FIG. 22 or FIG. 23, the field-effect transistor according to the twelfth embodiment has the narrow recess 22 wider than the gate opening 20 and the wide recess 21 wider than the narrow recess 22 in the same manner as that of the eleventh embodiment. In addition, the field-effect transistor according to the twelfth embodiment includes the Si-doped AlGaAs layer (high concentration) 34 provided on the surface layer of the undoped AlGaAs layer 8.

Due to a multistage recess structure with the wide recess 21, the narrow recess 22, and the gate opening 20, the field-effect transistor according to the twelfth embodiment realizes a high breakdown voltage and reduction of a parasitic resistance, and further realizes a low on-resistance, the effect of reduction of a gate leakage current, and an improvement of a drain breakdown voltage to each gate voltage.

[Thirteenth Embodiment]

Figure 24:
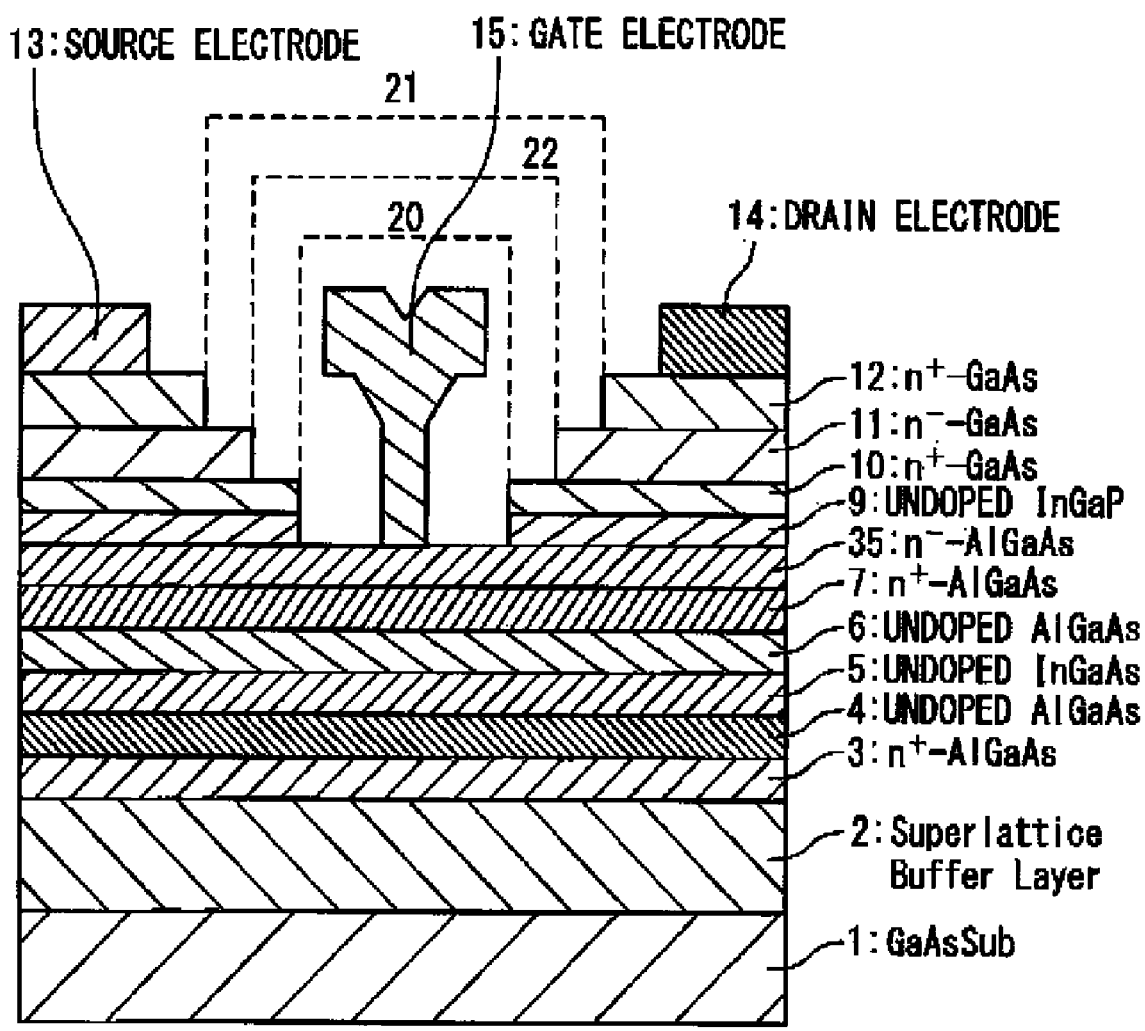
FIG. 24 is a cross-sectional view of a field-effect transistor according to a thirteenth embodiment of the present invention.
Figure 25:
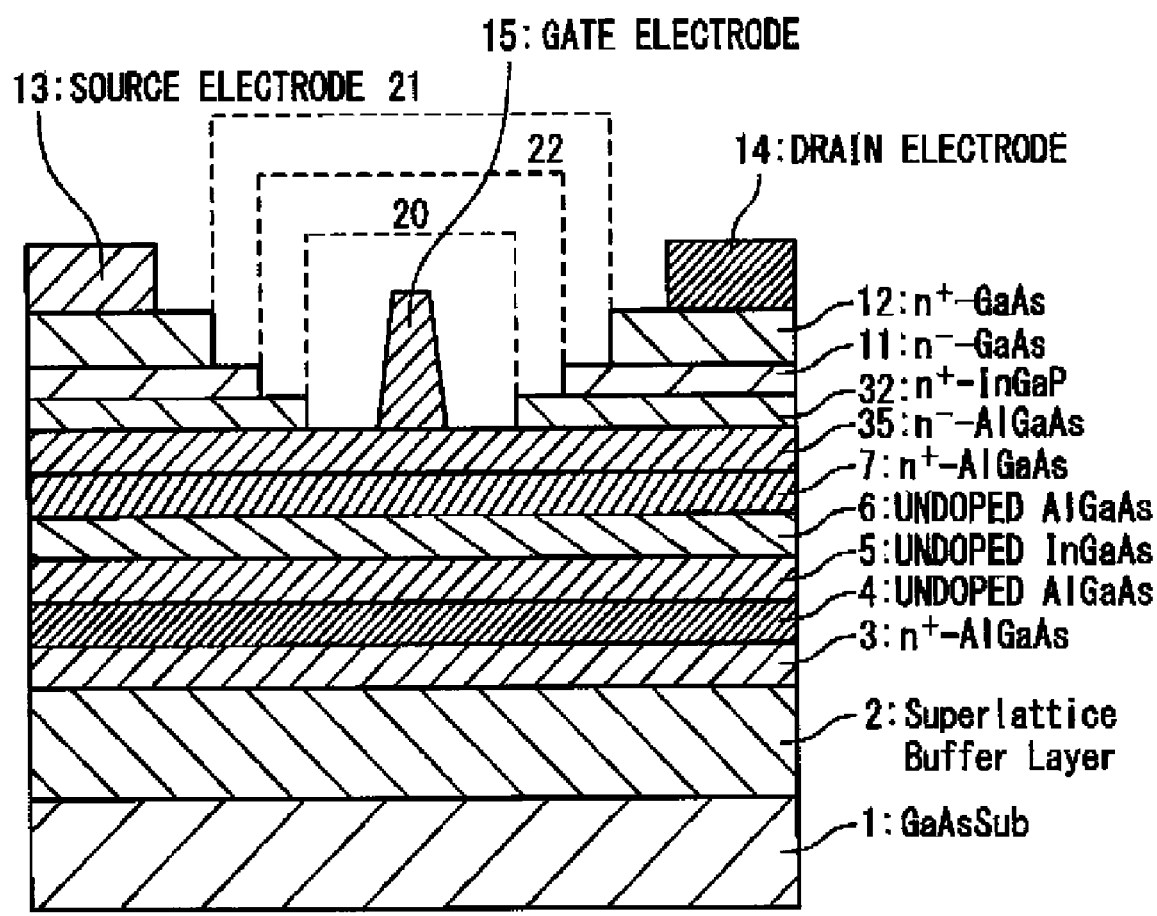
FIG. 25 is a cross-sectional view of the field-effect transistor according to the thirteenth embodiment.

The field-effect transistor according to a thirteenth embodiment of the present invention will be described below with reference to the drawings. FIG. 24 is a cross-sectional view showing the structure of the field-effect transistor according to the thirteenth embodiment. In addition, FIG. 25 is a cross-sectional view showing another structure of the field-effect transistor according to the thirteenth embodiment. As shown in FIG. 24 or FIG. 25, the field-effect transistor according to the thirteenth embodiment has the narrow recess 22 wider than the gate opening 20 and the wide recess 21 wider than the narrow recess 22 in the same manner as that of the eleventh embodiment. In addition, the field-effect transistor according to the thirteenth embodiment includes the Si-doped AlGaAs layer (low concentration) 35.

Due to a multistage recess structure with the wide recess 21, the narrow recess 22, and the gate opening 20, the field-effect transistor according to the thirteenth embodiment realizes a high breakdown voltage and reduction of a parasitic resistance, and further realizes a low on-resistance, the effect of reduction of a gate leakage current, and an improvement of a drain breakdown voltage to each gate voltage.

The embodiments of the present invention have been concretely described above. The present invention is not limited to the above-described embodiments, and can be variously changed without departing from the scope of the present invention. In addition, the above-described embodiments can be carried out in combination with each other within a scope in which the configurations without contradiction.

What is claimed is:

1. A field effect transistor comprising:
    a Schottky layer;
    a stopper layer formed of InGaP and provided in a recess region on said Schottky layer;
    a cap layer provided on said stopper layer and formed of GaAs; and
    a barrier rising suppression region configured to suppress rising of a potential barrier due to interface charge between said stopper layer and said cap layer,
    wherein said cap layer comprises:
    a high concentration cap layer; and
    a low concentration cap layer having an impurity provided directly or indirectly under said high concentration cap layer and having an impurity concentration lower than said high concentration cap layer,
    wherein said barrier rising suppression region is provided for a layer between said stopper layer and said low concentration cap layer, and comprises a GaAs electron compensation layer which contains said impurity of a higher concentration than said low concentration cap layer.

2. The field effect transistor according to claim 1, wherein said stopper layer formed from order-InGaP which forms a spontaneous superlattice.

3. The field effect transistor according to claim 2, wherein said stopper layer is formed without intentionally adding any impurity.

4. The field effect transistor according to claim 1, wherein said low concentration cap layer has a film thickness in a range from 50 nm to 100 nm.

5. The field effect transistor according to claim 1, wherein said Schottky layer is formed without intentionally adding an n-type impurity.

6. The field effect transistor according to claim 1, wherein said Schottky layer is mainly formed of AlGaAs.

7. The field effect transistor according to claim 1, wherein said recess region is formed such that an opening in said cap layer is coincident with an opening in said stopper layer.

8. The field effect transistor according to claim 1, wherein said recess region is formed such that an opening in said cap layer is wider than an opening in said stopper layer.

9. The field effect transistor according to claim 8, wherein said opening in said cap layer is formed such that an opening in said high concentration cap layer is wider than an opening in said low concentration cap layer.

10. The field effect transistor according to claim 1, wherein said impurity is Si.

11. A field effect transistor comprising:
    a Schottky layer;
    a stopper layer (9) formed of InGaP and provided in a recess region (20) on said Schottky layer;
    a cap layer (11, 12) provided on said stopper layer and formed of GaAs; and
    a barrier rising suppression region (10) comprised of a Si-doped GaAs carrier compensation layer provided in the recess region (20) on said Schottky layer, the Si-doped GaAs carrier compensation layer located between said stopper layer (9) and said cap layer (11, 12), the barrier rising suppression region (10) configured to suppress rising of a potential barrier due to interface charge between said stopper layer and said cap layer,
    wherein said cap layer comprises:
    a high concentration cap layer (12); and
    a low concentration cap layer (11) provided directly or indirectly under said high concentration cap layer and having an impurity concentration lower than said high concentration cap layer and lower than said Si-doped GaAs carrier compensation layer.

12. The field effect transistor according to claim 11, wherein said Si-doped GaAs carrier compensation layer has a Si impurity of approximately $3.0 \times 10^{18}$ cm$^{-3}$.

* * * * *